(12) United States Patent
Ushikura et al.

(10) Patent No.: US 10,838,082 B2
(45) Date of Patent: *Nov. 17, 2020

(54) RADIATION DETECTOR AND RADIOGRAPHIC IMAGING APPARATUS

(71) Applicant: FUJIFILM CORPORATION, Tokyo (JP)

(72) Inventors: Shinichi Ushikura, Kanagawa (JP); Keiichi Akamatsu, Kanagawa (JP); Haruyasu Nakatsugawa, Kanagawa (JP); Naoyuki Nishinou, Kanagawa (JP); Shunsuke Kodaira, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/026,056

(22) Filed: Jul. 3, 2018

(65) Prior Publication Data
US 2018/0313961 A1    Nov. 1, 2018

Related U.S. Application Data

(63) Continuation of application No. PCT/JP2018/010048, filed on Mar. 14, 2018.

(30) Foreign Application Priority Data

Mar. 22, 2017 (JP) .................. 2017-056559
Feb. 16, 2018 (JP) .................. 2018-025803

(51) Int. Cl.
*G01T 1/20* (2006.01)
*G01T 1/24* (2006.01)
(Continued)

(52) U.S. Cl.
CPC ............ *G01T 1/2018* (2013.01); *G01T 1/241* (2013.01); *G01T 1/246* (2013.01); *H01L 27/146* (2013.01);
(Continued)

(58) Field of Classification Search
CPC ....... G01T 1/2018; G01T 1/241; G01T 1/246; H01L 27/146; H01L 31/0248
(Continued)

(56) References Cited

U.S. PATENT DOCUMENTS 6,510,195 B1 * 1/2003 Chappo ................. G01T 1/2018
                                                250/208.1
6,559,451 B1 * 5/2003 Izumi .................... H01L 27/12
                                                250/370.01
(Continued)

FOREIGN PATENT DOCUMENTS

JP    2011-237176 A    11/2011
JP    2013-224949 A    10/2013
(Continued)

OTHER PUBLICATIONS

International Search Report issued in International Application No. PCT/JP2018/010048 dated Jun. 12, 2018.
(Continued)

*Primary Examiner* — Taeho Jo
(74) *Attorney, Agent, or Firm* — Solaris Intellectual Property Group, PLLC

(57) ABSTRACT

The radiation detector includes: a sensor board including a flexible substrate and a layer which is provided on a first surface of the substrate and in which a plurality of pixels, which accumulate electrical charges generated in accordance with light converted from radiation, are formed; a conversion layer that is provided on a side, opposite to the substrate, of the layer in which the pixels are formed, and
(Continued)

converts radiation into light; protective film that covers at least the conversion layer; a reinforcing member provided on a second surface opposite to the first surface of the substrate; and a supporting member that supports the reinforcing member with the reinforcing member sandwiched between the supporting member and the second surface of the substrate.

24 Claims, 16 Drawing Sheets

(51) Int. Cl.
    *H01L 27/146* (2006.01)
    *H01L 31/0248* (2006.01)
    *H01L 31/102* (2006.01)
    *H01L 31/0232* (2014.01)

(52) U.S. Cl.
    CPC .... *H01L 31/0248* (2013.01); *H01L 31/02325* (2013.01); *H01L 31/102* (2013.01)

(58) Field of Classification Search
    USPC .................................................. 250/370.08
    See application file for complete search history.

(56) References Cited

U.S. PATENT DOCUMENTS

| | | | | |
|---|---|---|---|---|
| 7,618,511 B2* | 11/2009 | Sato | ...... | G01T 1/2018 156/248 |
| 8,841,621 B2* | 9/2014 | Nariyuki | ...... | G01T 1/2002 250/366 |
| 9,513,383 B1* | 12/2016 | Cao | ...... | G01T 1/2018 |
| 2001/0030291 A1* | 10/2001 | Homme | ...... | C23C 16/458 250/483.1 |
| 2002/0190223 A1* | 12/2002 | Homme | ...... | C30B 29/54 250/483.1 |
| 2008/0067392 A1* | 3/2008 | Miyaguchi | ...... | G01T 1/2018 250/370.11 |
| 2008/0217550 A1* | 9/2008 | Shoji | ...... | G01T 1/2018 250/370.11 |
| 2008/0308736 A1* | 12/2008 | Suzuki | ...... | G01T 1/20 250/370.08 |
| 2009/0026382 A1* | 1/2009 | Sakamoto | ...... | G01T 1/246 250/370.09 |
| 2010/0258730 A1* | 10/2010 | Sumi | ...... | G01T 1/2018 250/361 R |
| 2011/0180714 A1* | 7/2011 | Okada | ...... | G01T 1/243 250/354.1 |
| 2012/0217404 A1* | 8/2012 | Iwakiri | ...... | H01L 27/14663 250/361 R |
| 2012/0219114 A1* | 8/2012 | Iwakiri | ...... | G03B 42/04 378/62 |
| 2012/0256095 A1* | 10/2012 | Nakatsugawa | ...... | G01T 1/2002 250/368 |
| 2012/0267535 A1* | 10/2012 | Nakatsugawa | ...... | A61B 6/548 250/362 |
| 2012/0273685 A1* | 11/2012 | Nakatsugawa | ...... | G21K 4/00 250/361 R |
| 2013/0043400 A1 | 2/2013 | Nakatsugawa et al. | | |
| 2013/0092840 A1* | 4/2013 | Ohta | ...... | G03B 42/025 250/361 R |
| 2013/0099130 A1* | 4/2013 | Nakahashi | ...... | A61B 6/00 250/394 |
| 2013/0099344 A1* | 4/2013 | Ishii | ...... | H01L 27/14618 257/432 |
| 2013/0112882 A1* | 5/2013 | Osawa | ...... | G01T 1/2006 250/361 R |
| 2013/0154039 A1* | 6/2013 | Furui | ...... | H01L 27/14663 257/428 |
| 2013/0161522 A1* | 6/2013 | Ishida | ...... | G01T 1/2006 250/366 |
| 2014/0027647 A1 | 1/2014 | Matsumoto | | |
| 2014/0374608 A1* | 12/2014 | Sasaki | ...... | H01L 27/14632 250/366 |
| 2015/0369931 A1* | 12/2015 | Nakahashi | ...... | G01T 1/2018 250/361 R |
| 2016/0027847 A1* | 1/2016 | Liu | ...... | A61B 6/4233 378/62 |
| 2016/0064680 A1* | 3/2016 | An | ...... | H01L 27/308 378/62 |
| 2016/0116606 A1* | 4/2016 | Itaya | ...... | G01T 1/2023 250/366 |
| 2016/0204164 A1* | 7/2016 | Zhao | ...... | G01T 1/2018 250/369 |
| 2016/0322418 A1* | 11/2016 | Leblans | ...... | G01T 1/2018 |
| 2017/0082558 A1* | 3/2017 | Liu | ...... | G01T 1/2018 |

FOREIGN PATENT DOCUMENTS

| | | |
|---|---|---|
| JP | 2014-41116 A | 3/2014 |
| JP | 2016-128790 A | 7/2016 |
| JP | 2016-180707 A | 10/2016 |
| WO | 2014/050862 A1 | 4/2014 |

OTHER PUBLICATIONS

English language translation of the following: Office action dated Apr. 2, 2019 from the JPO in a Japanese patent application No. 2018-522814 corresponding to the instant patent application.
English language translation of the following: Written Opinion of the International Searching Authority, dated Jun. 12, 2018, in International Application No. PCT/JP2018/010048, corresponding to the instant patent application.
English language translation of the following: Office action dated Oct. 29, 2019 from the JPO in a Japanese patent application No. 2018-522814 corresponding to the instant patent application.

* cited by examiner

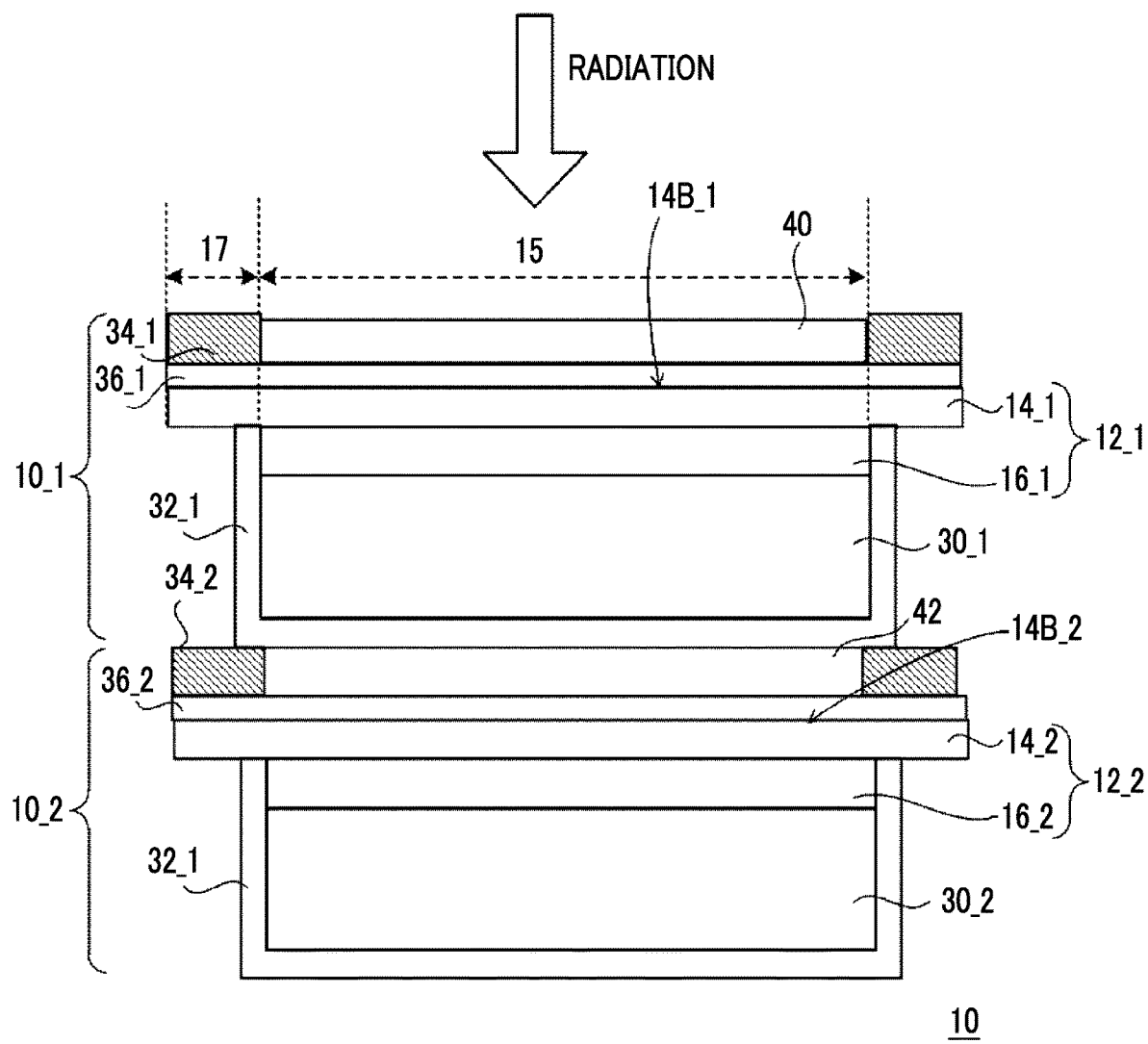

RADIATION DETECTOR AND RADIOGRAPHIC IMAGING APPARATUS

CROSS-REFERENCE TO RELATED APPLICATIONS

This application is a continuation application of International Application No. PCT/JP2018/010048, filed on Mar. 14, 2018, the entire disclosure of which is incorporated by reference herein. Further, this application claims priority from Japanese Patent Application No. 2017-056559, filed on Mar. 22, 2017, and Japanese Patent Application No. 2018-025803, filed on Feb. 16, 2018, the entire disclosures of which are incorporated by reference herein.

BACKGROUND

Technical Field

The present invention relates to a radiation detector and a radiographic imaging apparatus.

Related Art

In the related art, radiographic imaging apparatuses that perform radiographic imaging for medical diagnosis have been known. A radiation detector for detecting radiation transmitted through a subject and generating a radiation image is used for such radiographic imaging apparatuses.

As the radiation detector, there is one including a sensor board in which a conversion layer, such as a scintillator, which converts radiation into light, and a plurality of pixels that accumulate electrical charges generated in accordance with light converted in the conversion layer.

It is desired to use a flexible substrate for this sensor board. By using the flexible substrate, for example, the weight of a radiographic imaging apparatus (radiation detector) can be reduced, and a subject can be easily imaged.

In a case where the flexible substrate is used for the sensor board, deflection occurs in the substrate, that is, the sensor board. As the deflection occurs in the sensor board, for example, there is a case where the durability and the dampproofness of the conversion layer degrades.

Thus, as the technique of enhancing the stiffness of the sensor board, for example, JP2016-180707A discloses a technique of providing a buffer part between a top plate of a housing, which houses the radiation detector, and the sensor board, thereby enhancing the stiffness of the sensor board, and allowing the top plate and the sensor board to be mutually reinforced.

Generally, the stiffness of the resinous substrate is lower compared to that of the glass substrate. Therefore, there is a case where deflection easily occurs, particularly, discontinuous deflection occurs such that the entire substrate is not integrally deflected but is partially or locally deflected. For example, in the technique described in JP2016-180707A, there is a concern that deflection occurs partially or locally at a boundary between a region where the buffer part is provided, and a region where no buffer part is provided.

In a case where the entire substrate is integrally deflected, the influence on an image exerted by the deflection can be suppressed by performing image correction. However, in a case where imaging is performed in a state where the discontinuous deflection has occurred in the substrate, there are many cases where it becomes difficult to suppress the influence that the discontinuous deflection has on the image quality of the radiation image through the image correction. For example, an artifact or the like may occur in the radiation image, and there is a concern to that the image quality deteriorates.

SUMMARY

The present disclosure provides a radiation detector and a radiographic imaging apparatus that can suppress discontinuous deflection of a sensor board using a flexible substrate.

A radiation detector of a first aspect of the present disclosure includes: a sensor board including a flexible substrate and a layer which is provided on a first surface of the substrate and in which a plurality of pixels, which accumulate electrical charges generated in accordance with light converted from radiation, are formed; a conversion layer that is provided on a side, opposite to the substrate, of the layer in which the pixels are formed, and converts radiation into light; a protective film that covers at least the conversion layer; a reinforcing member that reinforces the flexible substrate; and a supporting member that supports the sensor board together with the reinforcing member.

Additionally, in the radiation detector of a second aspect of the present disclosure based on the first aspect, the reinforcing member is provided on a second surface opposite to the first surface of the substrate, and wherein the supporting member supports the reinforcing member with the reinforcing member sandwiched between the supporting member and the second surface of the substrate.

Additionally, in the radiation detector of a third aspect of the present disclosure based on the second aspect, the supporting member supports the reinforcing member with the reinforcing member sandwiched between the supporting member and a region on the second surface corresponding to a region outside a pixel region that is a region, on the first surface of the substrate, where the plurality of pixels are provided.

Additionally, in the radiation detector of a fourth aspect of the present disclosure based on the second aspect, the plurality of pixels include a plurality of first pixels, and a plurality of second pixels that are provided at an outer peripheral part of the plurality of first pixels and have a different application from the plurality of first pixels in forming a radiation image, and the supporting member supports the reinforcing member with the reinforcing member sandwiched between the supporting member and a region, on the second surface of the substrate, corresponding to the outside of a region where the first pixels are provided.

Additionally, in the radiation detector of a fifth aspect of the present disclosure, the supporting member includes a first supporting member that supports the reinforcing member with the reinforcing member sandwiched between the first supporting member and a first region corresponding to an end part of the second surface of the substrate, and a second supporting member that supports the reinforcing member with the reinforcing member sandwiched between the second supporting member and a region, on the second surface of the substrate, outside the first region.

Additionally, in the radiation detector of a sixth aspect of the present disclosure based on the fifth aspect, the first supporting member and the second supporting member are thermally connected together.

Additionally, in the radiation detector of a seventh aspect of the present disclosure based on the fifth or sixth aspect, the sensor board has an outer peripheral part including a connecting part to which at least one of a first cable or a second cable is connected, the first cable being connected to a drive unit that causes electrical charges to be read therethrough from the plurality of pixels, and the second cable being connected to a signal processing unit that receives electrical signals according to the electric charges read from the plurality of pixels and generates image data according to the received electrical signals to output the generated image data, and the first supporting member and the second supporting member are thermally connected together outside a region of an outer peripheral part having the connecting part.

Additionally, in the radiation detector of an eighth aspect of the present disclosure based on any one aspect of the second to seventh aspects, the protective film further covers a predetermined region in an outer peripheral part of the second surface of the substrate, and the supporting member supports the reinforcing member with the reinforcing member sandwiched between the supporting member the second surface of the substrate in the predetermined region.

Additionally, in the radiation detector of a ninth aspect of the present disclosure based on the eighth aspect, the protective film includes at least a first protective film that covers at least the conversion layer, and a second protective film that covers a region including the predetermined region and the entire first protective film.

Additionally, in the radiation detector of a tenth aspect of the present disclosure based on the eighth aspect, the protective film includes at least a first protective film that covers at least the conversion layer, and a second protective film that covers a region including the predetermined region and an end part of the first protective film.

Additionally, the radiation detector of an eleventh aspect of the present disclosure based on any one aspect of the second to tenth aspects further comprises a reinforcing layer that is provided on a surface of the conversion layer opposite to a surface provided on the sensor board.

Additionally, in the radiation detector of a twelfth aspect of the present disclosure based on the first aspect, the conversion layer includes a pixel region where the plurality of pixels contributing to formation of an image are provided and is provided in a state where a range wider than the pixel region is covered, and the supporting member is provided in a region straddling a region corresponding to an end part of the conversion layer, outside a region, corresponding to the pixel region, on the second surface opposite to the first surface of the substrate.

Additionally, in the radiation detector of a thirteenth aspect of the present disclosure based on the twelfth aspect, the reinforcing member is provided outside a region, on the second surface of the substrate, where the supporting member is provided.

Additionally, in the radiation detector of a fourteenth aspect of the present disclosure based on the twelfth aspect, the reinforcing member covers the second surface of the substrate in a state where the supporting member is provided.

Additionally, in the radiation detector of a fifteenth aspect of the present disclosure based on the twelfth aspect, the reinforcing member is provided on a side of the conversion layer opposite to the sensor board with the protective film sandwiched therebetween, and at least a partial region of the supporting member and a partial region of the reinforcing member face each other with the sensor board and the conversion layer sandwiched therebetween.

Additionally, in the radiation detector of a sixteenth aspect of the present disclosure based on the twelfth aspect, the reinforcing member includes a first reinforcing member provided on a side of the conversion layer opposite to the sensor board with the protective film sandwiched therebetween, and a second reinforcing member provided on a second surface opposite to the first surface of the substrate, and at least a partial region of the supporting member and a partial region of the first reinforcing member face each other with the second reinforcing member, the sensor board and the conversion layer sandwiched therebetween.

Additionally, in the radiation detector of a seventeenth aspect of the present disclosure based on the twelfth aspect, the reinforcing member covers the entire sensor board in a state where the conversion layer, the protective film, the supporting member are provided.

Additionally, in the radiation detector of an eighteenth aspect of the present disclosure based on any one aspect of the twelfth to seventeenth aspects, a thickness of the supporting member is greater than a thickness of the reinforcing member.

Additionally, the radiation detector of a nineteenth aspect of the present disclosure based on any one of the first to eighteen aspects is used for imaging in which a second surface opposite to the first surface of the substrate is irradiated with radiation.

Additionally, in the radiation detector of a twentieth aspect of the present disclosure based on any one aspect of the first to nineteenth aspects, the conversion layer includes CsI.

Additionally, a radiographic imaging apparatus of a twenty first aspect of the present disclosure comprises the radiation detector according to any one aspect of the first to twentieth aspects; a control unit that outputs control signals for reading electrical charges accumulated in the plurality of pixels; a drive unit that outputs a driving signal for reading the electrical charges from the plurality of pixels in accordance with the control signals; and a signal processing unit that receives electrical signals according to the electrical charges read from the plurality of pixels and generates image data according to the received electrical signals to output the generated image data.

Additionally, in the radiographic imaging apparatus of a twenty second aspect of the present disclosure based on the twenty first aspect, the control unit and the radiation detector are provided side by side in a direction intersecting a lamination direction in which a substrate in the radiation detector, a layer in which the plurality of pixels are formed, and a conversion layer are arranged.

Additionally, the radiographic imaging apparatus of a twenty third aspect of the present disclosure based on the twenty first aspect further comprises a power source unit that supplies electrical power to at least one of the control unit, the drive unit, or the signal processing unit. The power source unit, the control unit, and the radiation detector are provided side by side in a direction intersecting a lamination direction in which a substrate in the radiation detector, a layer in which the plurality of pixels are formed, and a conversion layer are arranged.

According to the present disclosure, the discontinuous deflection of the sensor board using the flexible substrate can be suppressed.

BRIEF DESCRIPTION OF THE DRAWINGS

FIG. 26 is a cross-sectional view of an example of a plurality of radiation detectors in the radiographic imaging apparatus including the plurality of (two) radiation detectors.

DESCRIPTION OF EMBODIMENTS

Hereinafter, embodiments of the invention will be described in detail with reference to the drawings. In addition, the present embodiments do not limit the invention.

First Embodiment

A radiographic imaging apparatus of the present embodiment has a function to capture a radiation image of an object to be imaged, by detecting radiation transmitted through a subject, which is an object to be imaged, and outputting image information representing a radiation image of the subject.

Figure 1:
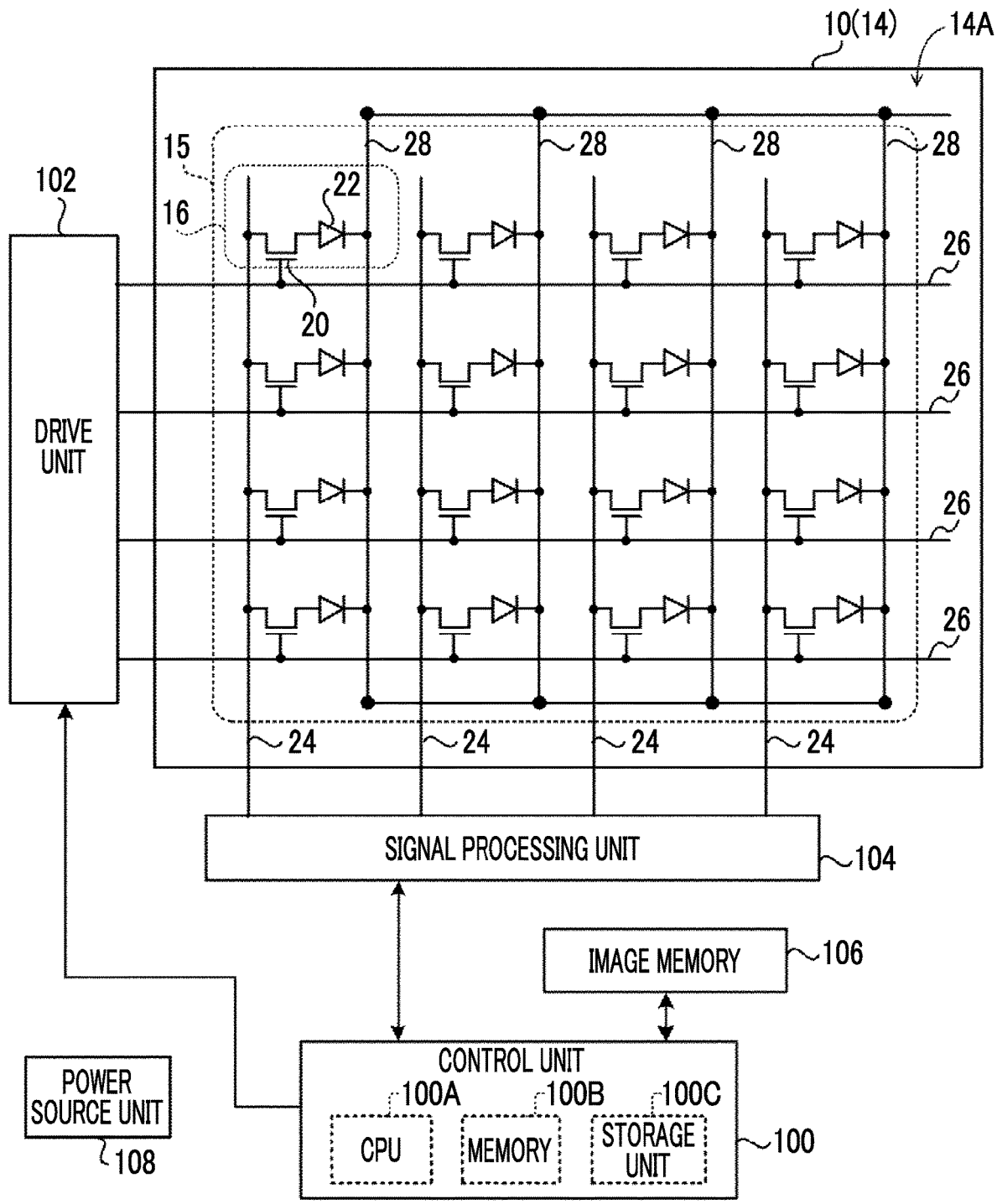
FIG. 1 is a block diagram illustrating an example of the configuration of main parts of an electrical system in a radiographic imaging apparatus of a first embodiment.

First, the outline of an example of the configuration of an electrical system in the radiographic imaging apparatus of the present embodiment will be described with reference to FIG. 1. FIG. 1 is a block diagram illustrating an example of the configuration of main parts of the electrical system in the radiographic imaging apparatus of the present embodiment.

As illustrated in FIG. 1, the radiographic imaging apparatus 1 of the present embodiment includes a radiation detector 10, a control unit 100, a drive unit 102, a signal processing unit 104, an image memory 106, and a power source unit 108.

The radiation detector 10 includes a sensor board 12 (refer to FIG. 3) and a conversion layer 30 (refer to FIG. 3) that converts radiation into light. The sensor board 12 includes a flexible substrate 14 and a plurality of pixels 16 provided on a first surface 14A of the substrate 14. In addition, in the following, the plurality of pixels 16 are simply referred to as "pixels 16".

As illustrated in FIG. 1, each pixel 16 of the present embodiment includes a sensor part 22 that generates and accumulates an electrical charge in accordance with the light converted by the conversion layer, and a switching element 20 that reads the electrical charge accumulated in the sensor part 22. In the present embodiment, as an example, a thin film transistor (TFT) is used as the switching element 20. For that reason, in the following, the switching element 20 is referred to as a "TFT 20". In the present embodiment, a layer in which the pixels 16 are formed on the first surface 14A of the substrate 14 is provided as a flattened layer in which the sensor parts 22 and the TFTs 20 are formed. In the following, there is a case where the layer in which the pixels 16 are formed is also referred to as the "pixels 16" for convenience of description.

The pixels 16 are two-dimensionally disposed in one direction (a scanning wiring direction corresponding to a cross direction of FIG. 1, hereinafter referred to as a "row direction"), and a direction intersecting the row direction (a signal wiring direction corresponding to the longitudinal direction of FIG. 1, hereinafter referred as a "column direction") in an active area 15 of the sensor board 12. Although an array of the pixels 16 are illustrated in a simplified manner in FIG. 1, for example, 1024×1024 pixels 16 are disposed in the row direction and the column direction.

Additionally, a plurality of scanning wiring lines 26, which are provided for respective rows of the pixels 16 to control switching states (ON and OFF) of the TFTs 20, and a plurality of signal wiring lines 24, which are provided for respective columns of the pixels 16 and from which electrical charges accumulated in the sensor parts 22 are read, are provided in a mutually intersecting manner in the radiation detector 10. The plurality of scanning wiring lines 26 are respectively connected to a drive unit 102 via pads (not illustrated). The control unit 100 to be described below is connected to the drive unit 102, and outputs driving signals in accordance with a control signal output from the control unit 100. In the plurality of individual scanning wiring lines 26, driving signals, which are output from the drive unit 102 to drive the TFTs 20 to control the switching states thereof, flow to the plurality of scanning wiring lines 26, respectively. Additionally, the plurality of signal wiring lines 24 are respectively connected to the signal processing unit 104 via pads (not illustrated), respectively, and thereby, electrical charges read from the respective pixels 16 are output to the signal processing unit 104 as electrical signals. The signal processing unit 104 generates and outputs image data according to the input electrical signals.

The control unit 100 to be described below is connected to the signal processing unit 104, and the image data output from the signal processing unit 104 is sequentially output to the control unit 100. The image memory 106 is connected to the control unit 100, and the image data sequentially output from the signal processing unit 104 is sequentially stored in the image memory 106 under the control of the control unit 100. The image memory 106 has a storage capacity capable of storing image data equivalent to a predetermined number of sheets, and whenever radiation images are captured, image data obtained by the capturing is sequentially stored in the image memory 106.

The control unit 100 includes a central processing unit (CPU) 100A, a memory 100B including a read only memory (ROM), a random access memory (RAM), and the like, and a nonvolatile storage unit 100C, such as a flash memory. An example of the control unit 100 is a microcomputer or the like. The control unit 100 controls the overall operation of the radiographic imaging apparatus 1.

Additionally, common wiring lines 28 are provided in a wiring direction of the signal wiring lines 24 at the sensor parts 22 of the respective pixels 16 in order to apply bias voltages to the respective pixels 16. Bias voltages are applied to the respective pixels 16 from a bias power source by connecting the common wiring lines 28 to the bias power source (not illustrated) outside the sensor board 12 via a pad (not illustrated).

The power source unit 108 supplies electrical power to various elements or various circuits, such as the control unit 100, the drive unit 102, the signal processing unit 104, the image memory 106, and power source unit 108. In addition, in FIG. 1, illustration of wiring lines, which connect the power source unit 108 and various elements or various circuits together, is omitted in order to avoid complication.

Figure 2:
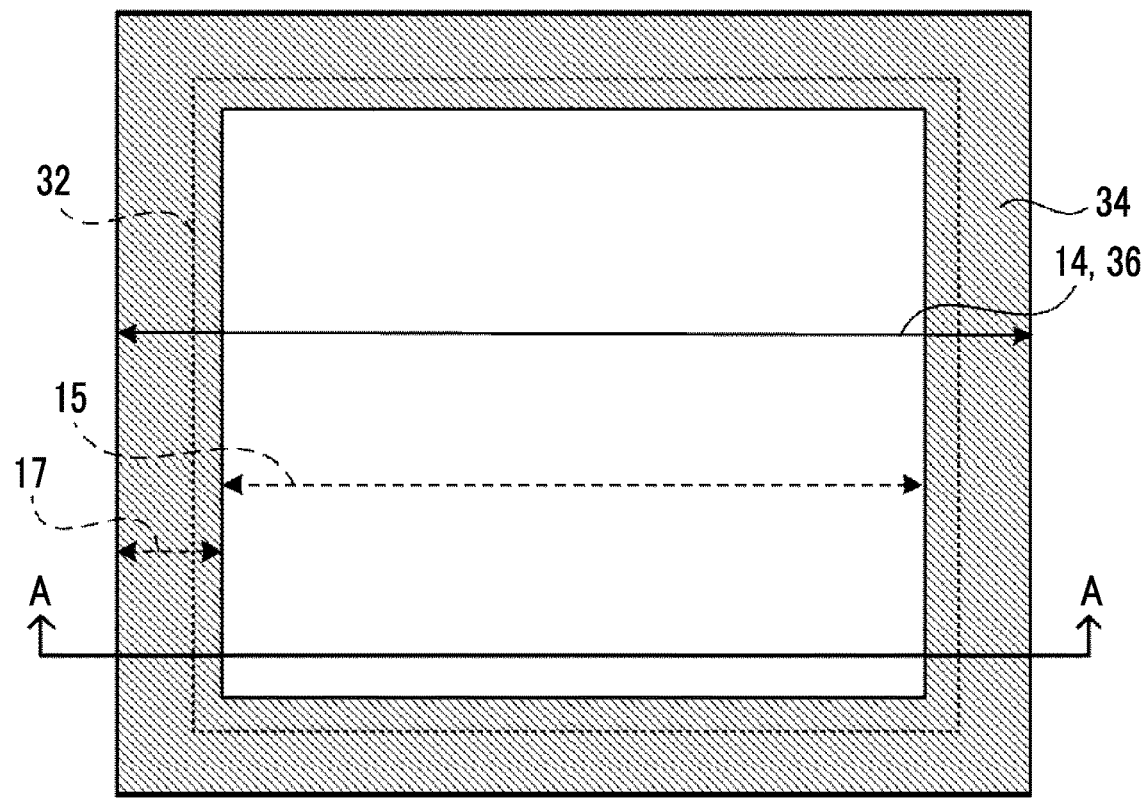
FIG. 2 is a plan view of the example of the radiation detector of the first embodiment as seen from a second surface side.

Moreover, the radiation detector 10 of the present embodiment will be described in detail. FIG. 2 is a plan view of the radiation detector 10 of the present embodiment as seen from a second surface 14B opposite to the first surface 14A. Additionally, FIG. 3 is a cross-sectional view taken along line A-A of the radiation detector 10 in FIG. 2.

Figure 3:
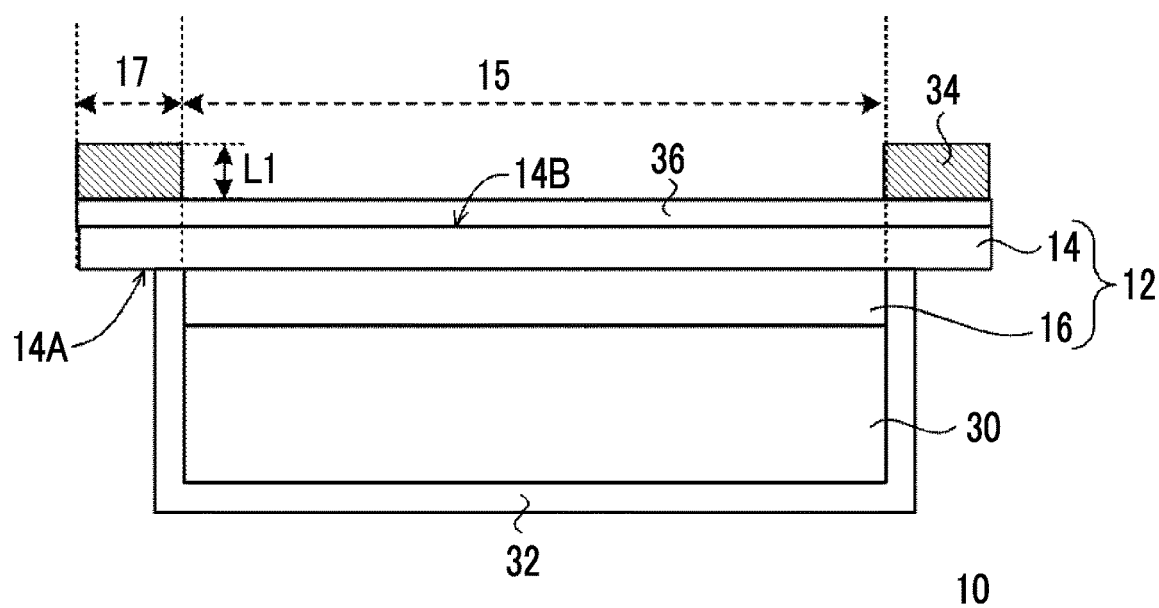
FIG. 3 is a cross-sectional view taken along line A-A of the radiation detector illustrated in FIG. 2.

As illustrated in FIGS. 2 and 3, the radiation detector 10 of the present embodiment includes the sensor board 12 having the substrate 14 and the pixels 16, a conversion layer 30, a protective film 32, a supporting member 34, and a reinforcing member 36, and the reinforcing member 36, the substrate 14, the pixels 16, and the conversion layer 30 are provided in this order. In addition, in the following, a direction (upward-downward direction in FIG. 3) in which the reinforcing member 36, the substrate 14, the pixels 16, and the conversion layer 30 are arranged is referred to as a lamination direction.

The substrate 14 is a resin sheet having flexibility and including, for example, plastics, such as polyimide. A specific example of the substrate 14 is XENOMAX (registered trademark). In addition, the substrate 14 may have any desired flexibility and is not limited to the resin sheet. For example, the substrate 14 may be a thin substrate made of relatively thin glass. The thickness of the substrate 14 may be a thickness such that desired flexibility is obtained in accordance with the hardness of a material, the size of the sensor board 12 (the area of the first surface 14A or the second surface 14B), or the like. For example, in a case where the substrate 14 is the resin sheet, the thickness thereof may be 5 µm to 125 µm. Additionally, for example, in a case where the substrate 14 is the substrate made of glass, generally, the substrate 14 has flexibility in a case where the thickness thereof becomes 0.1 mm or less in a size in which one side is about 43 cm, and has a tendency to be deflected similarly to the substrate 14 made of resin. Therefore, the thickness may be 0.1 mm or less.

As illustrated in FIGS. 2 and 3, the plurality of pixels 16 are provided in an inner partial region on the first surface 14A of the substrate 14. That is, in the sensor board 12 of the present embodiment, no pixel 16 is provided at an outer peripheral part of the first surface 14A of the substrate 14. In the present embodiment, the region on the first surface 14A of the substrate 14 where the pixels 16 are provided is used as the active area 15. Additionally, the region on the second surface 14B opposite to the active area 15 of the substrate 14 is referred to as "a region on the second surface 14B corresponding to the active area 15". The active area 15 of the present embodiment is an example of the pixel region of the present disclosure. In addition, in the present embodiment, as an example, the pixels 16 are provided on the first surface 14A of the substrate 14 via an undercoat layer (not illustrated) using SiN or the like.

Additionally, as illustrated in FIG. 3, the conversion layer 30 covers the active area 15. In the present embodiment, a scintillator including CsI (cesium iodide) is used as an example of the conversion layer 30. It is preferable that such a scintillator includes, for example, CsI:Tl (cesium iodide to which thallium is added) or CsI:Na (cesium iodide to which sodium is added) having an emission spectrum of 400 nm to 700 nm at the time of X-ray irradiation. In addition, the emission peak wavelength in a visible light region of CsI:Tl is 565 nm.

In the present embodiment, the conversion layer 30 of CsI is directly formed as a columnar crystal on the sensor board 12 by a vapor-phase deposition method, such as a vacuum vapor deposition method, a sputtering method, and a chemical vapor deposition (CVD) method. In this case, the side of the conversion layer 30, which in contact with the pixels 16, becomes a base point side in a growth direction of the columnar crystal.

In addition, in this way, in a case where the conversion layer of CsI is directly formed on the sensor board 12 by the vapor-phase deposition method, for example, a reflective layer (not illustrated) having a function to reflect the light converted in the conversion layer 30 may be provided on the surface of the conversion layer opposite to the side in contact with the sensor board 12. The reflective layer may be directly provided in the conversion layer 30, and or may be provided via an adhesion layer or the like. As a material in this case, it is preferable to use an organic material, and it is preferable to use, for example, at least one of white polyethylene terephthalate (PET), $TiO_2$, $Al_2O_3$, foamed white PET, a polyester-based high-reflection sheet, specular reflection aluminum, or the like. Particularly, it is preferable to use the white PET as the material from a viewpoint of reflectivity.

In addition, the white PET is obtained by adding a white pigment, such as $TiO_2$ or barium sulfate, to PET. Additionally, the polyester-based high-reflection sheet is a sheet (film) having a multilayer structure in which a plurality of thin polyester sheets are laminated. Additionally, the foamed white PET is white PET of which the front surface is porous.

Additionally, in a case where the scintillator of CsI is used as the conversion layer 30, the conversion layer 30 can also be formed in the sensor board 12 by a method different from that of the present embodiment. For example, the conversion layer 30 may be formed in the sensor board 12 by preparing CsI vapor-deposited on an aluminum sheet or the like by the vapor-phase deposition method, and gluing the side of CsI, which is not in contact with the aluminum sheet, and the pixels 16 of the sensor board 12 together with an adhesive sheet or the like.

Moreover, unlike the radiation detector 10 of the present embodiment, GOS ($Gd_2O_2S$:Tb) or the like may be used as the conversion layer 30 instead of CsI. In this case, for example, the conversion layer 30 can be formed in the sensor board 12 by preparing a sheet glued on a support formed of the white PET or the like with an adhesion layer or the like, the sheet being obtained by dispersing GOS in a binder, such as resin, and by gluing the side of GOS on which the support is not glued, and the pixels 16 of the sensor board 12 together with an adhesive sheet or the like.

Additionally, in the radiation detector 10 of the present embodiment, as illustrated in FIGS. 2 and 3, the reinforcing member 36 is provided on the second surface 14B of the substrate 14. In the present embodiment, as an example, the reinforcing member 36 is provided on the entire second surface 14B of the substrate 14.

The reinforcing member 36 reinforces the strength (stiffness) of the substrate 14. Additionally, the reinforcing member 36 of the present embodiment has dampproofness, and suppresses entering of humidity (moisture) from the second surface 14B of the substrate 14.

Moreover, the reinforcing member 36 of the present embodiment has an antistatic property. Since the substrate 14 of the present embodiment has flexibility, and the thickness of the substrate 14 is thinner than the radiation detector that does not have general flexibility, the substrate 14 is easily charged due to friction or the like. The charging of the substrate 14 can be suppressed because the reinforcing member 36 has the antistatic property.

Such a reinforcing member 36 is, for example, an LAP-PET (registered trademark) sheet obtained by laminating aluminum, such as by bonding aluminum foil, on the insulating sheet (film), such as polyethylene terephthalate.

Figure 4:
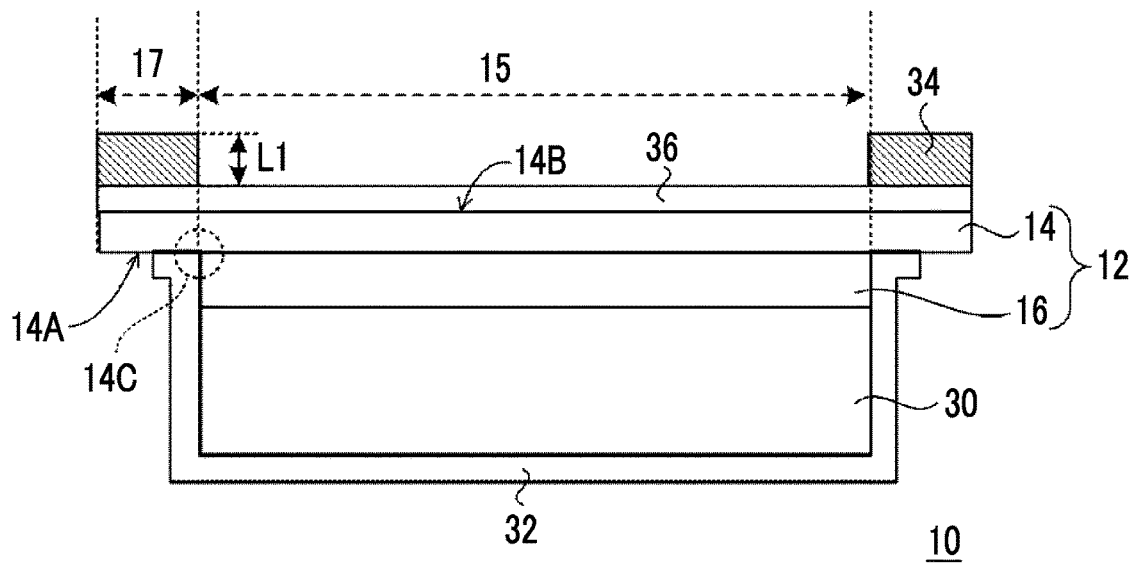
FIG. 4 is a cross-sectional view, taken along line A-A, of another example of the radiation detector of the first embodiment.

Additionally, in the radiation detector 10 of the present embodiment, as illustrated in FIGS. 2 and 3, the protective film 32 covers the conversion layer 30. Specifically, the protective film 32 covers the front surface (the surface that is not in contact with the pixels 16) of the conversion layer 30, the side surface of the conversion layer 30, and the side surface of the pixels 16. In addition, the protective film 32 illustrated in FIG. 3 covers the side surface of the pixels 16. However, a form in which the first protective film 32A does not cover a part or the entirety of the side surface of the pixels 16 may be adopted. Additionally, although a form in which an end part (side surface) of the protective film 32 is in contact with the first surface 14A of the substrate 14 is illustrated as the protective film 32 illustrated in FIG. 3. However, the end part of the protective film 32 and the first surface 14A of the substrate 14 may not be in contact with each other. Additionally, as illustrated in FIG. 4, the end part of the first protective film 32A may be bent at a corner part 14C that is a boundary of the first surface 14A of the substrate 14 where the pixels 16 are formed, and the first protective film 32A may cover the front surface of the first surface 14A in the vicinity of the corner part 14C.

As the protective film 32, for example, a dampproofness film, such as a PARYLENE (registered trademark) film, or an insulating sheet, such as polyethylene terephthalate, is used.

Additionally, in the radiation detector 10 of the present embodiment, as illustrated in FIGS. 2 and 3, the supporting member 34 supports the reinforcing member 36 with the reinforcing member 36 sandwiched between the supporting member 34 and the region 17 of the second surface 14B of the substrate 14. That is, the supporting member 34 so-called backs up the substrate 14 via the protective film 32 and the reinforcing member 36 in the region 17. The supporting member 34 is fixed to the reinforcing member 36, for example, with an adhesive, such as double-stick tape or glue. In addition, the region 17 is a region of an outer peripheral part excluding a region corresponding to the active area 15 of the second surface 14B of the substrate 14, and the region 17 of the present embodiment corresponds to an example of a first region and an example of a predetermined region in the present disclosure.

In the supporting member 34 of the present embodiment, the stiffness thereof at least in an in-plane direction of the second surface 14B is higher than that of the substrate 14. The supporting member 34, is plastics, such as polyethylene terephthalate (PET), an aluminum sheet, or the like, which has a size with which desired stiffness is obtained. In addition, since the supporting member 34 of the present embodiment is provided outside the region corresponding to the active area 15 of the second surface 14B of the substrate 14, the transmittance and absorption of radiation in the supporting member 34 do not have large influence on capturing of a radiation image. In addition, as a thickness L1 of the supporting member 34 is thicker, a distance (FIG. 5, a distance L2 reference) from a subject to the pixels 16 becomes longer. Therefore, defocusing occurs in a captured radiation image. For that reason, it is preferable to set the thickness L1 of the supporting member 34 in accordance with desired stiffness and desired image quality.

The radiographic imaging apparatus 1 of the present embodiment is provided within a housing through which radiation is transmitted and which has waterproofness, antibacterial properties, and sealability.

Figure 5:
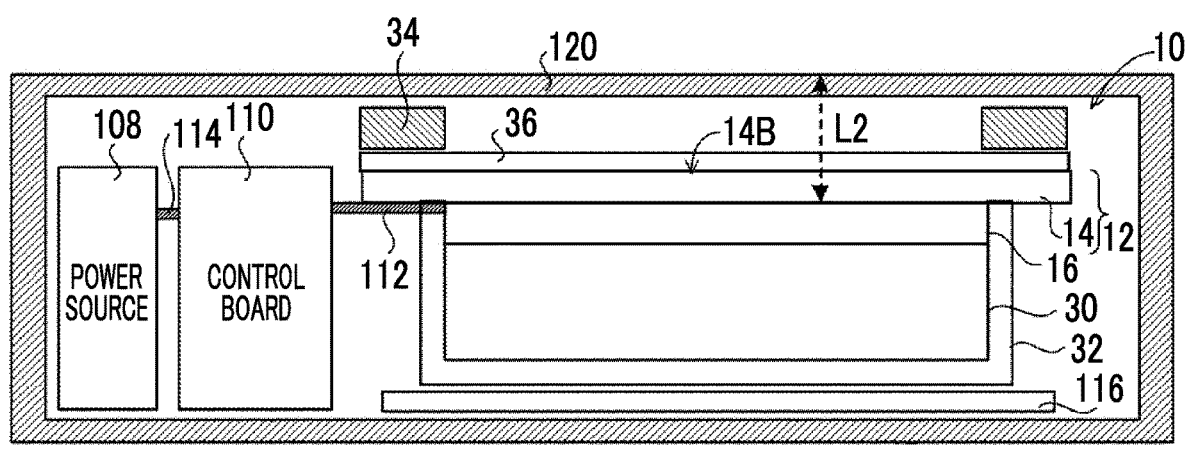
FIG. 5 is a cross-sectional view illustrating an example of a state where the radiation detector is provided within a housing in a case where the radiographic imaging apparatus of the first embodiment is applied to a surface reading type.

FIG. 5 is a cross-sectional view illustrating an example of a state where the radiation detector 10 is provided within a housing 120 in a case where the radiographic imaging apparatus 1 of the present embodiment is applied to an irradiation side sampling (ISS) type.

As illustrated in FIG. 5, the radiation detector 10, the power source unit 108, and a control board 110 are provided side by side in a direction intersecting the lamination direction within the housing 120. The radiation detector 10 is provided such that the second surface 14B of the substrate 14 faces an imaging surface 120A side of the housing 120 that is irradiated with radiation transmitted through a subject.

The control board 110 is a board in which the image memory 106, the control unit 100, and the like are formed, and is electrically connected to the pixels 16 of the sensor board 12 by a flexible cable 112 including signal wiring lines. In addition, in the present embodiment, the control board 110 is a so-called chip on film (COF) in which the drive unit 102 and the signal processing unit 104 are provided on the flexible cable 112. However, at least one of the drive unit 102 or the signal processing unit 104 may be formed in the control board 110.

Additionally, the control board 110 and the power source unit 108 are connected together by a power source line 114.

A sheet 116 is further provided on a side to which the radiation transmitted through the radiation detector 10 is emitted, within the housing 120 of the radiographic imaging apparatus 1 of the present embodiment. The sheet 116 is, for example, a copper sheet. The copper sheet does not easily generate secondary radiation due to incident radiation, and therefore, has a function to prevent scattering to the rear side, that is, the conversion layer 30. In addition, it is preferable that the sheet 116 covers at least an entire surface of the conversion layer 30 from which radiation is emitted, and covers the entire conversion layer 30, and it is more preferable that the sheet 116 covers the entire protective film 32. In addition, the thickness of the sheet 116 may be selected in accordance with the flexibility, weight, and the like of the entire radiographic imaging apparatus 1. For example, in a case where the sheet 116 is the copper sheet and in a case where the thickness of the sheet is about 0.1 mm or more, the sheet 116 also has a function to have flexibility and shield secondary radiation that has entered the inside of the radiographic imaging apparatus 1 from the outside. Additionally, for example, in a case where the sheet 116 is the copper sheet, it is preferable that the thickness is 0.3 mm or less from a viewpoint of flexibility and weight.

In the radiographic imaging apparatus 1 illustrated in FIG. 5, since the power source unit 108 and the control board 110 are provided at a peripheral part of the housing 120 having a relatively high stiffness, the influence of external forces to be given to the power source unit 108 and the control board 110 can be suppressed.

In addition, although FIG. 5 illustrates a form in which both the power source unit 108 and the control board 110 are provided on one side of the radiation detector 10, specifically, on one side of a rectangular radiation detector 10, a position where the power source unit 108 and the control board 110 are provided is not limited to the form illustrated in FIG. 5. For example, the power source unit 108 and the control board 110 may be provided so as to be respectively decentralized onto two facing sides of the radiation detector 10, or may be provided so as to be respectively decentralized onto two adjacent sides. Additionally, FIG. 5 illustrates a form in which the power source unit 108 and the control board 110 are one component part (board). However, the invention is not limited to the form illustrated in FIG. 5. A form in which at least one of the power source unit 108 or the control board 110 is a plurality of component parts (boards) may be adopted. For example, a form in which the power source unit 108 includes a first power source unit and a second power source unit (all are not illustrated) may be adopted, or the first power source unit and the second power source unit may be provided so as to be decentralized onto two facing sides of the radiation detector 10.

Figure 6:
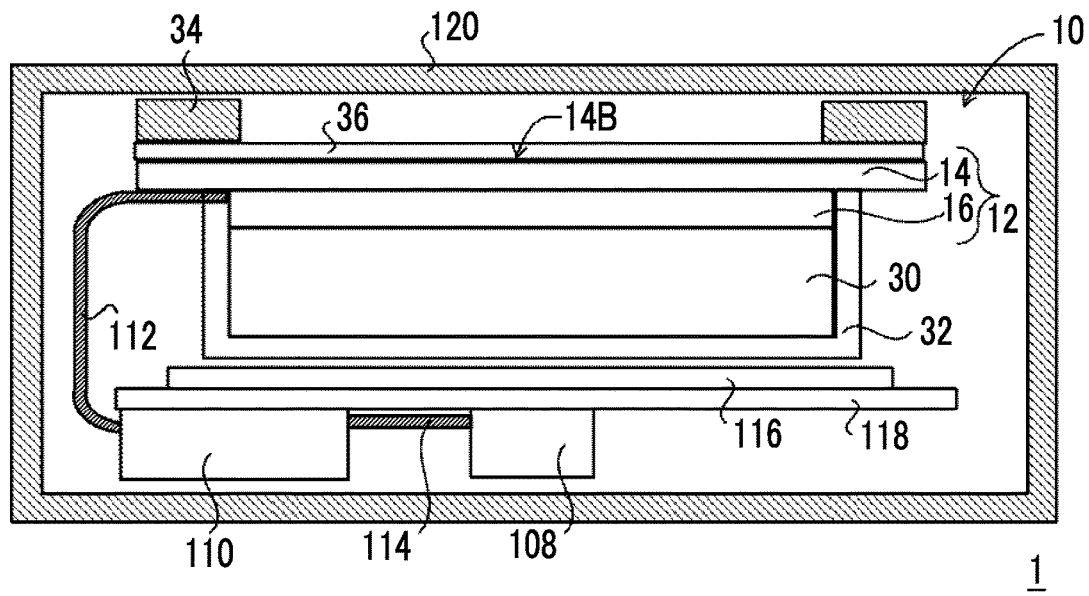
FIG. 6 is a cross-sectional view illustrating another example in the state where the radiation detector is provided within the housing in the case where the radiographic imaging apparatus of the first embodiment is applied to the surface reading type.

FIG. 6 is a cross-sectional view illustrating another example in a state where the radiation detector 10 is provided within the housing 120 in a case where the radiographic imaging apparatus 1 of the present embodiment is applied to the ISS type.

As illustrated in FIG. 6, the power source unit 108 and the control board 110 are provided are provided side by side in the direction intersecting the lamination direction within the housing 120, the radiation detector 10, the power source unit 108, and the control board 110 are provided side by side in the lamination direction.

Additionally, in the radiographic imaging apparatus 1 illustrated in FIG. 6, a base 118 that supports the radiation detector 10 and the control board 110 is provided between the control board 110 and the power source unit 108, and the sheet 116. For example, carbon or the like is used for the base 118.

Generally, in a case where the substrate 14 is a sheet made of resin or a thin plate made of relatively thin glass, the substrate 14 is easily deflected because its stiffness is lower compared to a substrate (relatively thick glass plate) made of glass. Particularly, discontinuous deflection is likely to occur in the resinous sheet compared to the glass plate.

Particularly, in a case where the substrate 14 is the sheet made of resin or the thin plate made of relatively thin glass, there is a case where the entire substrate 14 is not integrally deflected, but is partially or locally deflected or distorted, or its deflection direction differs for each position within the surfaces (the first surface 14A and the second surface 14B) of the substrate 14. The deflection or strain that occurs in such a case is referred to as the "discontinuous deflection" in the present embodiment with respect to a case where the entire substrate is integrally deflected.

In a case where a radiation image is captured in a state where the entire substrate 14 is integrally deflected, image correction is performed. Accordingly, the influence that the deflection of the substrate 14 has on the image quality of the radiation image can be suppressed, and deterioration of the image quality of the radiation image can be suppressed. However, in a case where imaging is performed in a state where the discontinuous deflection has occurred in the substrate 14, there are many cases where it becomes difficult to suppress the influence that the discontinuous deflection has on the image quality of the radiation image through the image correction. For example, an artifact or the like may occur in the radiation image, and there is a concern that the image quality deteriorates.

In contrast, in the radiation detector 10 of the present embodiment, the supporting member 34 supports the reinforcing member 36 with the reinforcing member 36 sandwiched between the supporting member and the second surface 14B, in the region 17 that is an outer peripheral region of the substrate 14. For that reason, the strain occurs at the end part of the substrate 14 can be suppressed by the supporting member 34 and the reinforcing member 36. Additionally, in the radiation detector 10 of the present embodiment, the reinforcing member 36 is provided over the entirety of the second surface 14B of the substrate 14 of the sensor board 12 to reinforce the stiffness of the substrate 14. For that reason, the occurrence of the discontinuous deflection in the substrate 14 12, that is, the sensor board can be suppressed.

Additionally, in the radiation detector 10 of the present embodiment, the supporting member 34 supports the substrate 14 via the reinforcing member 36 from the second surface 14B side. For that reason, according to the radiation detector 10 of the present embodiment, the reinforcing member 36 reinforces a boundary portion between a region in the substrate 14 where the supporting member 34 is provided and a region in the substrate 14 where the supporting member 34 is not provided. Accordingly, the discontinuous deflection occurring in the boundary portion can be suppressed.

Second Embodiment

Next, a second embodiment will be described. In addition, since the present embodiment is different from the first embodiment in terms of some of the components of the radiation detector 10, different components will be described with reference to drawings.

Figure 7:
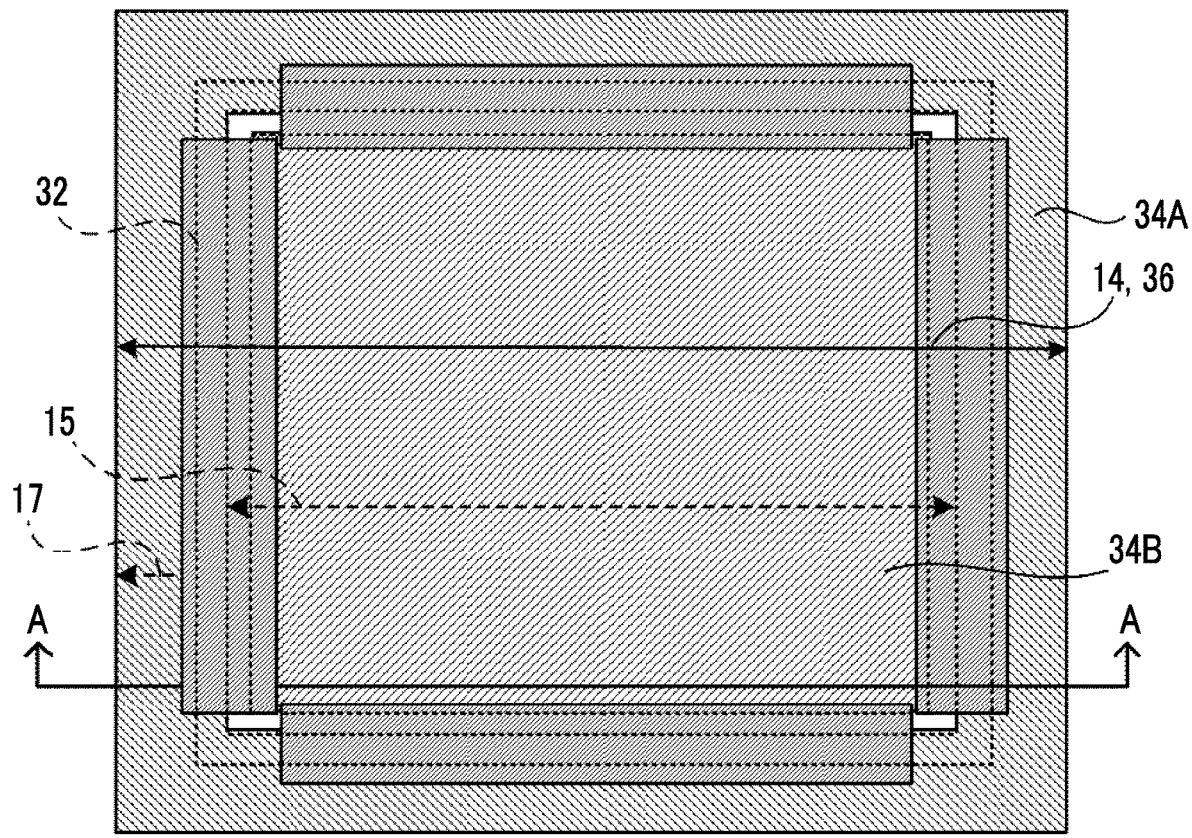
FIG. 7 is a plan view of an example of a radiation detector of a second embodiment as seen from a second surface side.
Figure 8:
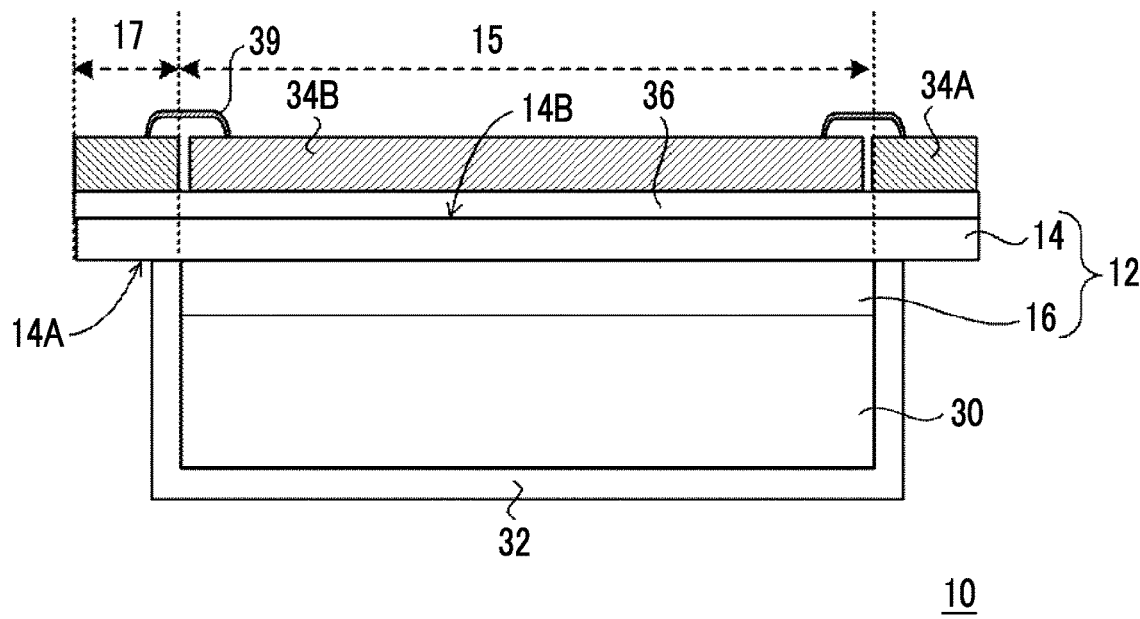
FIG. 8 is a cross-sectional view taken along line A-A of the radiation detector illustrated in FIG. 7.
Figure 9:
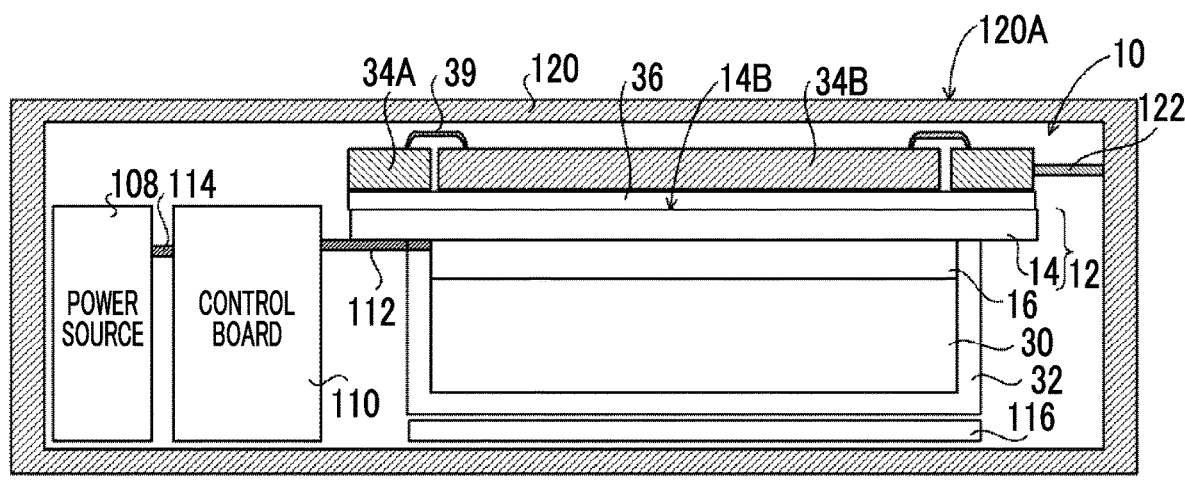
FIG. 9 is a cross-sectional view illustrating an example of a state where the radiation detector is provided within a housing in a case where a radiographic imaging apparatus of the second embodiment is applied to a surface reading type.

FIG. 7 is a plan view of the radiation detector 10 of the present embodiment as seen from the second surface 14B side of the substrate 14. Additionally, FIG. 8 is a cross-sectional view taken along line A-A of the radiation detector 10 in FIG. 7. FIG. 9 is a cross-sectional view illustrating an example of a state where the radiation detector 10 is provided within the housing 120 in a case where the radiographic imaging apparatus 1 of the present embodiment is applied to the ISS type.

As illustrated in FIGS. 7 and 8, the radiation detector 10 of the present embodiment includes a first supporting member 34A and a second supporting member 34B instead of the supporting member 34 of the first embodiment.

The first supporting member 34A corresponds to the supporting member 34 of the first embodiment, and has the same configuration and the same function.

Meanwhile, the second supporting member 34B is provided in a region that is surrounded by the first supporting member 34A of the reinforcing member 36 and corresponds to the active area 15 of the second surface 14B. As the second supporting member 34B of the present embodiment, a thermal diffusion member with a smaller heat capacity than the first supporting member 34A is used. Additionally, the second supporting member 34B has a higher stiffness than the first supporting member 34A. Additionally, since the second supporting member 34B of the present embodiment is provided in the region corresponding to the active area 15 of the second surface 14B, a member through which radiation is transmitted is used, and at least a member with a lower absorption and a higher transmittance of radiation than the first supporting member 34A is used. The second supporting member 34B having such properties is, for example, a graphite sheet.

In this way, the second supporting member 34B supports the reinforcing member 36 within the active area 15. Therefore, according to the radiation detector 10 of the present embodiment, the effect of suppressing the discontinuous deflection of the sensor board 12 can be further suppressed.

Additionally, in the radiation detector 10 of the present embodiment, as illustrated in FIGS. 7 and 8, the first supporting member 34A and the second supporting member 34B are thermally connected together by connecting the first supporting member 34A and the second supporting member 34B to a heat transfer member 39. In addition, the "thermally connected" may be a state where heat is conducted from one of the first supporting member 34A and the second supporting member 34B to the other, and also includes where the first supporting member 34A and the second supporting member 34B are not connected together by a certain member or the like, but the first supporting member 34A and the second supporting member 34B are provided away from each other at a distance enough to conduct heat, unlike the present embodiment.

In the ISS type radiographic imaging apparatus 1, the radiation detector 10 is irradiated with radiation from the sensor board 12 side. In the example illustrated in FIG. 9, in the capturing of a radiation image, a subject is disposed between the imaging surface 120A of the housing 120 and a radiation irradiating apparatus (not illustrated), and the imaging surface 120A is irradiated with radiation X transmitted through the subject.

In a case where a radiation image is captured in this way, the subject is located in the vicinity of the imaging surface 120A, or the imaging surface 120A and the subject come in contact with each other. For that reason, there is a case where heat, such as the body temperature of the subject, is transmitted from the subject to the radiation detector 10 via the housing 120. The heat transferred to the subject in this way is not uniformly transmitted within the active area 15 but is partially transmitted in many cases. For that reason, a heat distribution may occur within the active area 15 of the sensor board 12. The heat distribution occurring within the active area 15 in this way causes image unevenness in a captured radiation image.

In contrast, in the radiation detector 10 of the present embodiment, the heat transferred via the housing 120 can be decentralized within the active area 15 by the second supporting member 34B. Additionally, since heat can be transferred from the second supporting member 34B to the first supporting member 34A by the heat transfer member 39, the unevenness of the heat distribution within the active area 15 can be lowered.

Moreover, in the radiation detector 10 of the present embodiment, as illustrated in FIG. 9, the first supporting member 34A and a side surface (a surface intersecting the imaging surface 120A) of the housing 120 are connected together by a heat transfer member 122. By connecting the first supporting member 34A and the side surface of the housing 120 together by the heat transfer member 122 in this way, according to the radiographic imaging apparatus 1 of the present embodiment, heat can be dissipated to the housing 120 via the heat transfer member 122.

Third Embodiment

In the radiation detector 10 of the present embodiment, the region covered with the protective film 32 is different from the region covered with the protective film 32 of the first embodiment. Therefore, the protective film 32 in the radiation detector 10 of the present embodiment will be described.

Figure 10:
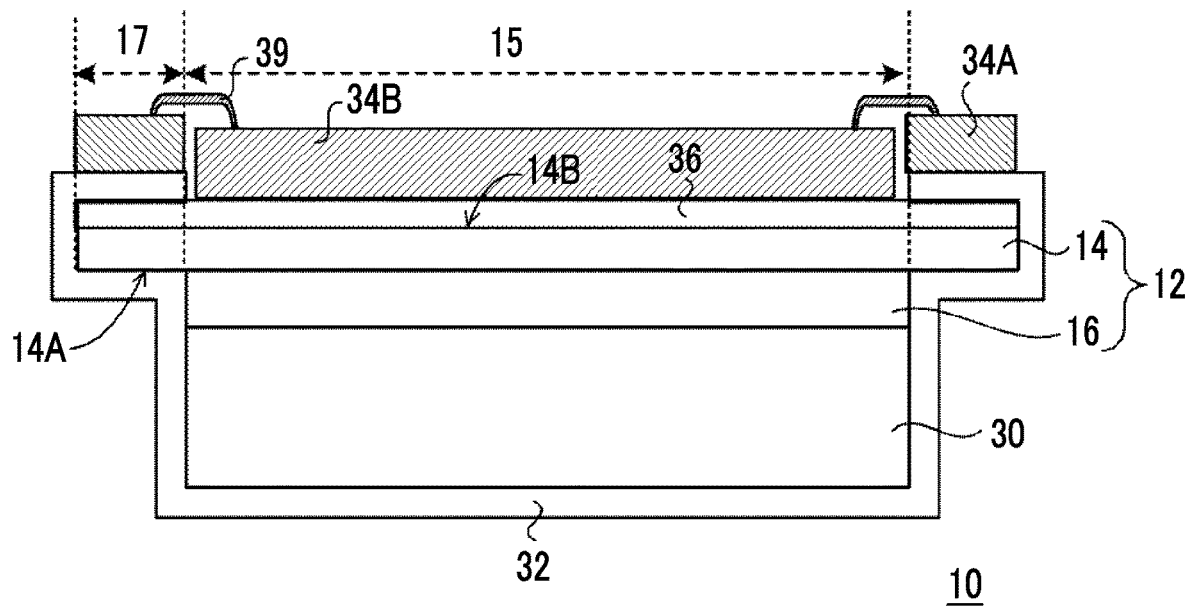
FIG. 10 is a cross-sectional view of an example of a radiation detector of a third embodiment.

A cross-sectional view of an example of the radiation detector 10 of the present embodiment is illustrated in FIG. 10. As illustrated in FIG. 10, the protective film 32 of the present embodiment covers the conversion layer 30, and further covers a region up to the region 17. Specifically, the protective film 32 covers the front surface (the surface that is not in contact with the pixels 16) of the conversion layer 30, a side surface of the conversion layer 30, and a side surface of the pixels 16, and further an entire region extending from the outer peripheral part of the first surface 14A to the region 17 of the reinforcing member 36 around a side surface of the substrate 14.

Such a protective film 32 is, for example, a parylene film, an insulating sheet, or the like. In the case of the parylene film, the protective film 32 can be formed by vapor deposition, and in the case of the insulating sheet, the protective film 32 can be provided by being glued with an adhesive or the like.

In the radiation detector 10 of the present embodiment illustrated in FIG. 10, the protective film 32 covers the conversion layer 30 and the pixels 16 and further covers even the region 17 in the outer peripheral part of the reinforcing member 36. Therefore, even in a case where the substrate 14 is deflected, the conversion layer 30 is not easily peeled. Additionally, in the radiation detector 10 of the present embodiment, the supporting member 34 supports the region 17, which is an outer peripheral region of the substrate 14, together with the protective film 32 with the reinforcing member 36 sandwiched therebetween. Therefore, even in a case where the flexible substrate 14 in the sensor board 12 is deflected, the deflection in the region 17 is suppressed by the supporting member 34. Therefore, since the protective film 32 is not peeled from the sensor board 12 and the conversion layer 30, the effect of suppressing the peeling of the conversion layer 30 can be further enhanced.

Generally, in a case where the conversion layer 30 is peeled or deteriorates due to humidity or the like, deterioration of the image quality of a generated radiation image is caused. In contrast, in the radiation detector 10 of the present embodiment, the peeling of the conversion layer 30 is suppressed and the degradation of dampproofness is suppressed. Therefore, the deterioration of the image quality of a generated radiation image can be suppressed.

Additionally, according to the radiation detector 10 of the present embodiment, similar to the radiation detector 10 of the second embodiment, the first supporting member 34A, the second supporting member 34B, the reinforcing member 36, and the heat transfer member 39 are included. Therefore, similar to the radiation detector 10 of the second embodiment, the effect of suppressing the discontinuous deflection of the sensor board 12 can be further enhanced, and the unevenness of the heat distribution within the active area 15 can be lowered.

Fourth Embodiment

In a radiation detector 10 of the present embodiment, a configuration corresponding to the protective film 32 of the first embodiment is different. Therefore, this different configuration will be described.

Figure 11:
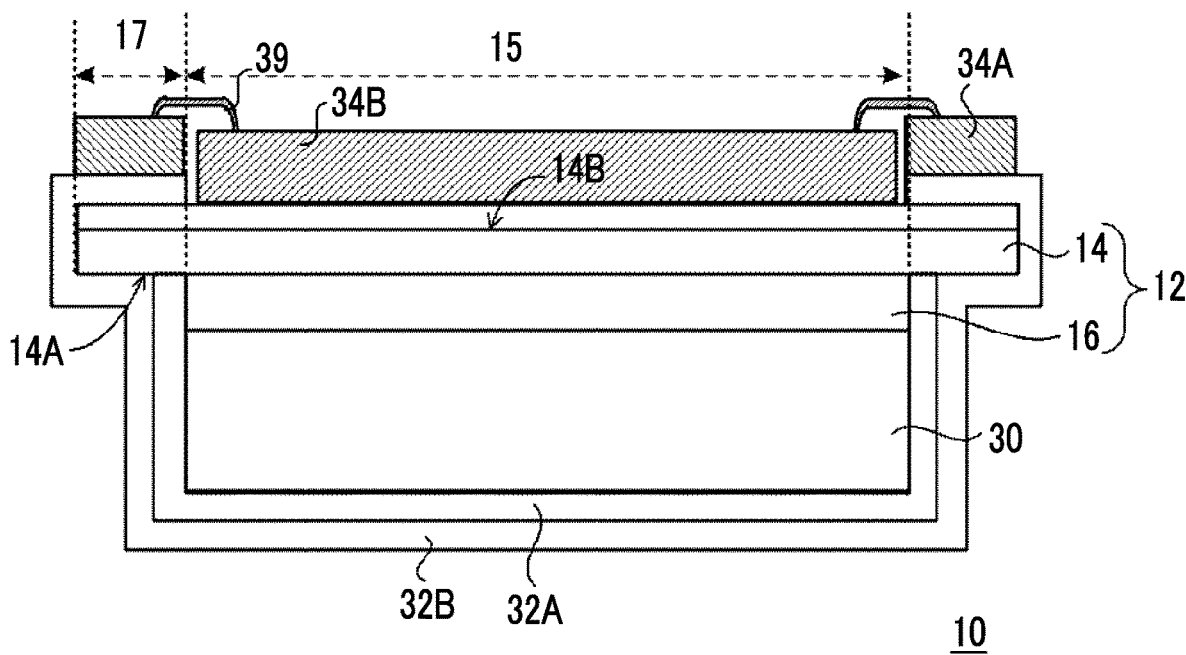
FIG. 11 is a cross-sectional view of an example of a radiation detector of a fourth embodiment.

A cross-sectional view of an example of the radiation detector 10 of the present embodiment is illustrated in FIG. 11. As illustrated in FIG. 11, the radiation detector 10 of the present embodiment includes two protective films of a first protective film 32A and a second protective film 32B, instead of the protective film 32 of the radiation detector 10 of the first embodiment.

As illustrated in FIG. 11, the first protective film 32A is provided similarly to the protective film 32 of the radiation detector 10 of the first embodiment, and covers the front surface (the surface that is not in contact with the pixels 16) of the conversion layer 30, the side surface of the conversion layer 30, and the side surface of the pixels 16.

Meanwhile, as illustrated in FIG. 11, the second protective film 32B covers a region including the region 17 and the entire first protective film 32A. Specifically, the second protective film 32B covers the conversion layer 30 and the pixels 16 that are covered with the first protective film 32A, and covers the same region as the protective film 32 of the third embodiment.

Such a first protective film 32A includes, for example, a parylene film or the like. In this case, the first protective film 32A can be formed by vapor deposition. Additionally, the second protective film 32B includes the insulating sheet or the like. In this case, the second protective film 32B can be provided by being glued with an adhesive or the like.

In the radiation detector 10 of the present embodiment illustrated in FIG. 11, double sealing is performed by covering the front surface and side surface of the conversion layer 30 with the first protective film 32A and the second protective film 32B, the dampproofness performance with respect to the conversion layer 30 can be further enhanced. Particularly, CsI is vulnerable to moisture, and in a case where moisture enters the interior of the radiation detector 10, there is concern to that the image quality of a radiation image may deteriorate. For that reason, in a case where CsI is used for the conversion layer 30, it is preferable to further enhance the dampproofness performance with respect to the conversion layer 30 as in the radiation detector 10 of the present embodiment.

Additionally, according to the radiation detector 10 of the present embodiment, similar to the radiation detector 10 of the second embodiment, the first supporting member 34A, the second supporting member 34B, the reinforcing member 36, and the heat transfer member 39 are included. Therefore, similar to the radiation detector 10 of the second embodiment, the effect of suppressing the discontinuous deflection of the sensor board 12 can be further enhanced, and the unevenness of the heat distribution within the active area 15 can be lowered.

Fifth Embodiment

In a radiation detector 10 of the present embodiment, a configuration corresponding to the protective film 32 of the first embodiment is different. Therefore, this different configuration will be described.

Figure 12:
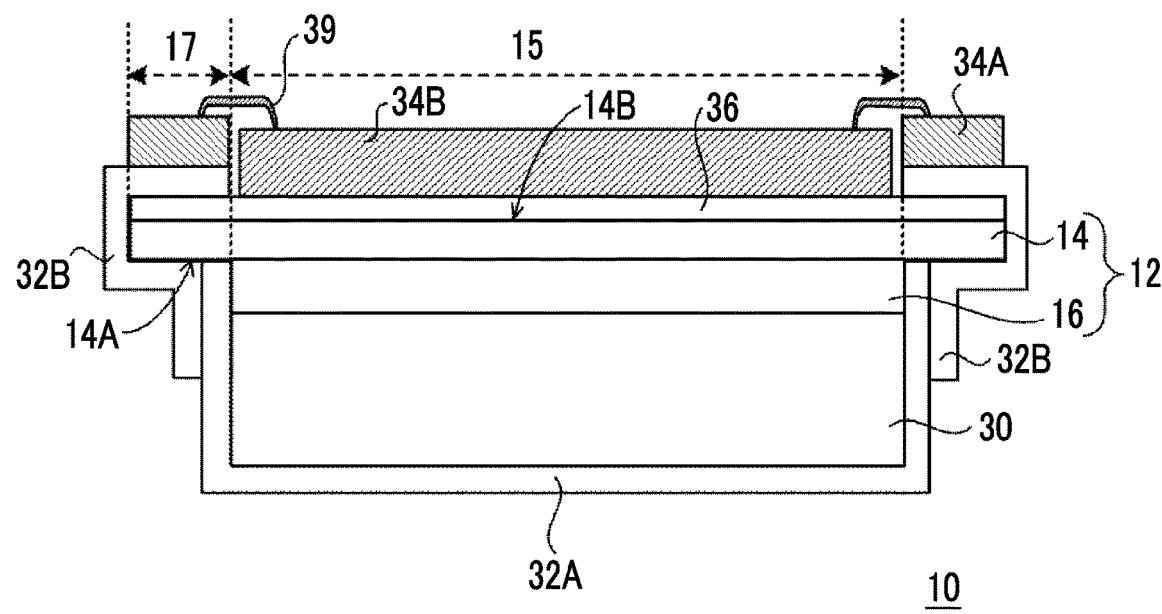
FIG. 12 is a cross-sectional view of an example of a radiation detector of a fifth embodiment.

A cross-sectional view of an example of the radiation detector 10 of the present embodiment is illustrated in FIG. 12. As illustrated in FIG. 12, the radiation detector 10 of the present embodiment includes two protective films of a first protective film 32A and a second protective film 32B, instead of the protective film 32 of the radiation detector 10 of the first embodiment.

As illustrated in FIG. 12, the first protective film 32A of the present embodiment covers at least the conversion layer 30. Specifically, the first protective film 32A of the present embodiment is provided similarly to the protective film 32 of the radiation detector 10 of the first embodiment, and covers the front surface (the surface that is not in contact with the pixels 16) of the conversion layer 30, the side surface of the conversion layer 30, and the side surface of the pixels 16.

Meanwhile, as illustrated in FIG. 12, the second protective film 32B covers a region including the region 17 and an end part of the first protective film 32A. Specifically, the second protective film 32B covers the region 17 of the reinforcing member 36, the side surface of the substrate 14, the region 17 of the first surface 14A of the substrate 14, and the region of the end part of the first protective film 32A. In addition, the region of the end part of the first protective film 32A that is covered with the second protective film 32B is a region within a predetermined range from an outer periphery of the first protective film 32A. In addition, the predetermined range is a range that is experimentally obtained on the basis of the position of the end part of the first protective film 32A in the side surface of the conversion layer 30 or the side surface of the pixels 16, the area of contact between the second protective film 32B and the first protective film 32A required to support the conversion layer 30, and the like.

Such first protective film 32A is, for example, the parylene film or the insulating sheet. in a case where the first protective film is the parylene film, the first protective film 32A can be formed by vapor deposition, and in a case where the first protective film is the insulating sheet, the first protective film 32A can be provided by being glued with an adhesive or the like.

Additionally, the second protective film 32B includes the insulating sheet or the like. In this case, the second protective film 32B can be provided by being glued with an adhesive or the like. In this way, in the radiation detector 10 of the present embodiment, the first protective film 32A and the second protective film 32B are integrated by gluing the first protective film 32A and the second protective film 32B together with an adhesive or the like.

In the radiation detector 10 of the present embodiment illustrated in FIG. 12, the first protective film 32A covers the front surface and the side surface of the conversion layer 30, and the side surface of the pixels 16, and the second protective film 32B covers the first surface 14A and the reinforcing member 36 in the outer peripheral part of the substrate 14 corresponding to the region 17, the side surface of the substrate 14, and the region of the end part of the first protective film 32A. Therefore, the effect of suppressing the peeling of the conversion layer 30 and suppressing the degradation of the dampproofness can be further enhanced similarly to the radiation detector 10 of the first embodiment.

Additionally, according to the radiation detector 10 of the present embodiment, similar to the radiation detector 10 of the second embodiment, the first supporting member 34A, the second supporting member 34B, the reinforcing member 36, and the heat transfer member 39 are included. Therefore, similar to the radiation detector 10 of the second embodiment, the effect of suppressing the discontinuous deflection of the sensor board 12 can be further enhanced, and the unevenness of the heat distribution within the active area 15 can be lowered.

Sixth Embodiment

In a radiation detector 10 of the present embodiment, a configuration corresponding to the protective film 32 of the first embodiment is different. Therefore, this different configuration will be described.

Figure 13:
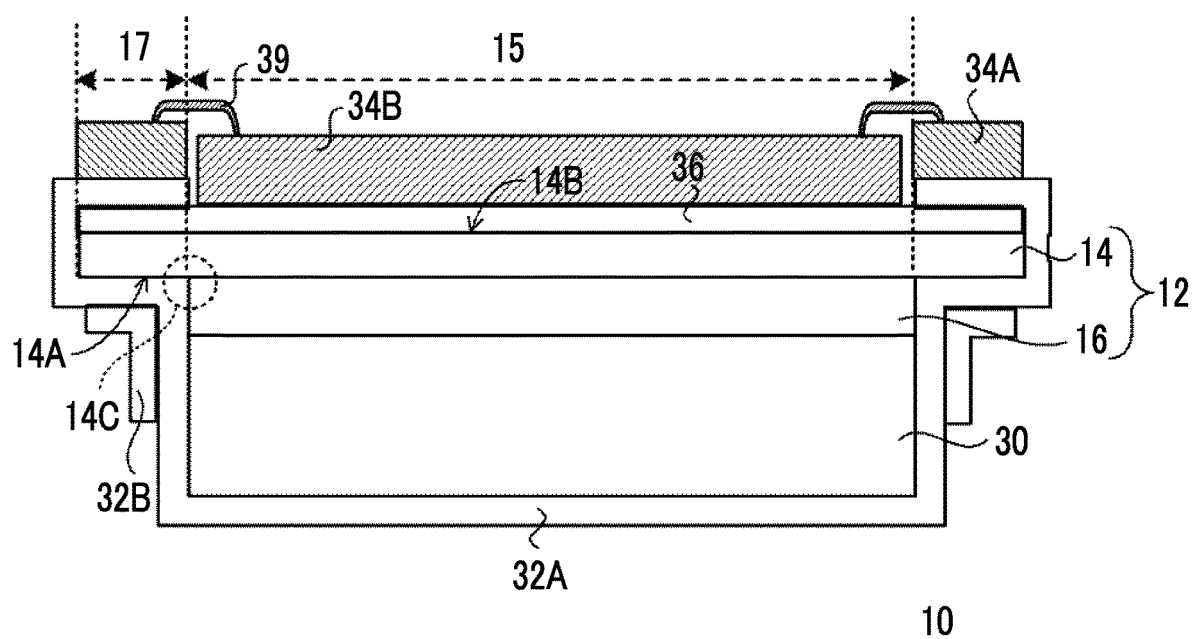
FIG. 13 is a cross-sectional view of an example of a radiation detector of a sixth embodiment.

A cross-sectional view of an example of the radiation detector 10 of the present embodiment is illustrated in FIG. 13. As illustrated in FIG. 13, the radiation detector 10 of the present embodiment includes two protective films of a first protective film 32A and a second protective film 32B, instead of the protective film 32 of the radiation detector 10 of the first embodiment.

As illustrated in FIG. 13, the first protective film 32A in the radiation detector 10 of the present embodiment is the same as the protective film 32 of the third embodiment.

Meanwhile, as illustrated in FIG. 13, the second protective film 32B of the present embodiment covers a region in the vicinity of the corner part 14C that is the boundary between the first surface 14A of the substrate 14 and the pixels 16 via the first protective film 32A. Specifically, the second protective film 32B covers a region ranging from the region corresponding to the region 17 of the substrate 14 to the side surface of the pixels 16 and a portion of the side surface of the conversion layer 30 via the first protective film 32A.

According to the radiation detector 10 of the present embodiment, the first protective film 32A is provided similarly to the protective film 32 of the third embodiment. Therefore, the effect of suppressing the peeling of the conversion layer 30 and suppressing the degradation of the dampproofness can be enhanced similarly to the radiation detector 10 of the third embodiment.

Additionally, according to the radiation detector 10 of the present embodiment, similar to the radiation detector 10 of the second embodiment, the first supporting member 34A, the second supporting member 34B, the reinforcing member 36, and the heat transfer member 39 are included. Therefore, similar to the radiation detector 10 of the second embodiment, the effect of suppressing the discontinuous deflection of the sensor board 12 can be further enhanced, and the unevenness of the heat distribution within the active area 15 can be lowered.

As described above, the radiation detector 10 of each of the above first to sixth embodiments includes the sensor board 12 including the flexible substrate 14, and the layer in which the plurality of pixels 16, which are provided on the first surface 14A of the substrate 14 and accumulate electrical charges generated in accordance with light converted from radiation, are formed, the conversion layer 30 that is provided on a side, opposite to the substrate 14, in the layer in which the pixels 16 are formed, and converts radiation into light, the protective film 32 that covers at least the conversion layer 30, the reinforcing member 36 that is provided on the second surface 14B opposite to the first surface 14A of the substrate 14, and the supporting member 34 that supports the reinforcing member 36 with the reinforcing member 36 sandwiched between the supporting member and the second surface 14B of the substrate 14.

In the radiation detector 10 of each of the above first to sixth embodiments, the supporting member 34 or 34A (hereinafter, generically referred to as the "supporting member 34" in a case where these supporting members are not distinguished) supports the reinforcing member 36 with the reinforcing member 36 sandwiched between the supporting member and the second surface 14B, in the region 17 that is the outer peripheral region of the substrate 14. For that reason, the strain occurs at the end part of the substrate 14 can be suppressed by the supporting member 34 and the reinforcing member 36. Additionally, in the radiation detector 10 of each of the above embodiments, the reinforcing member 36 is provided over the entirety of the second surface 14B of the substrate 14 of the sensor board 12 to reinforce the stiffness of the substrate 14. For that reason, the occurrence of the discontinuous deflection in the substrate 14 12, that is, the sensor board can be suppressed.

Additionally, in the radiation detector 10 of each of the above first to sixth embodiments, the supporting member 34 supports the substrate 14 via the reinforcing member 36 from the second surface 14B side. For that reason, according to the radiation detector 10 of each of the above embodiments, the reinforcing member 36 reinforces the boundary portion between the region in the substrate 14 where the supporting member 34 is provided and the region in the substrate 14 where the supporting member 34 is not provided. Accordingly, the discontinuous deflection occurring in the boundary portion can be suppressed.

Therefore, according to the radiation detector 10 of each of the above first to sixth embodiments, in a case where the flexible substrate 14 is used for the sensor board 12, the discontinuous deflection of the sensor board 12 using the flexible substrate 14 can be suppressed.

In addition, although a form in which the supporting member 34 is provided in the entire region 17 that is the region outside the region on the second surface 14B of the substrate 14 corresponding to the active area 15 has been described in each of the above first to sixth embodiments, positions where supporting members 34 are provided, the number of supporting members 34, and the like are not limited to each of the above individual embodiments. As described above, in a case where a form in which the reinforcing member 36 can be supported by the supporting member 34 with the reinforcing member 36 sandwiched between the supporting member and the second surface 14B of the substrate 14 is provided, it goes without saying that that the specific number of supporting members 34 and the size and the arrangement of individual supporting members 34 in a case where a plurality of supporting members 34 are provided are limited.

Figure 14:
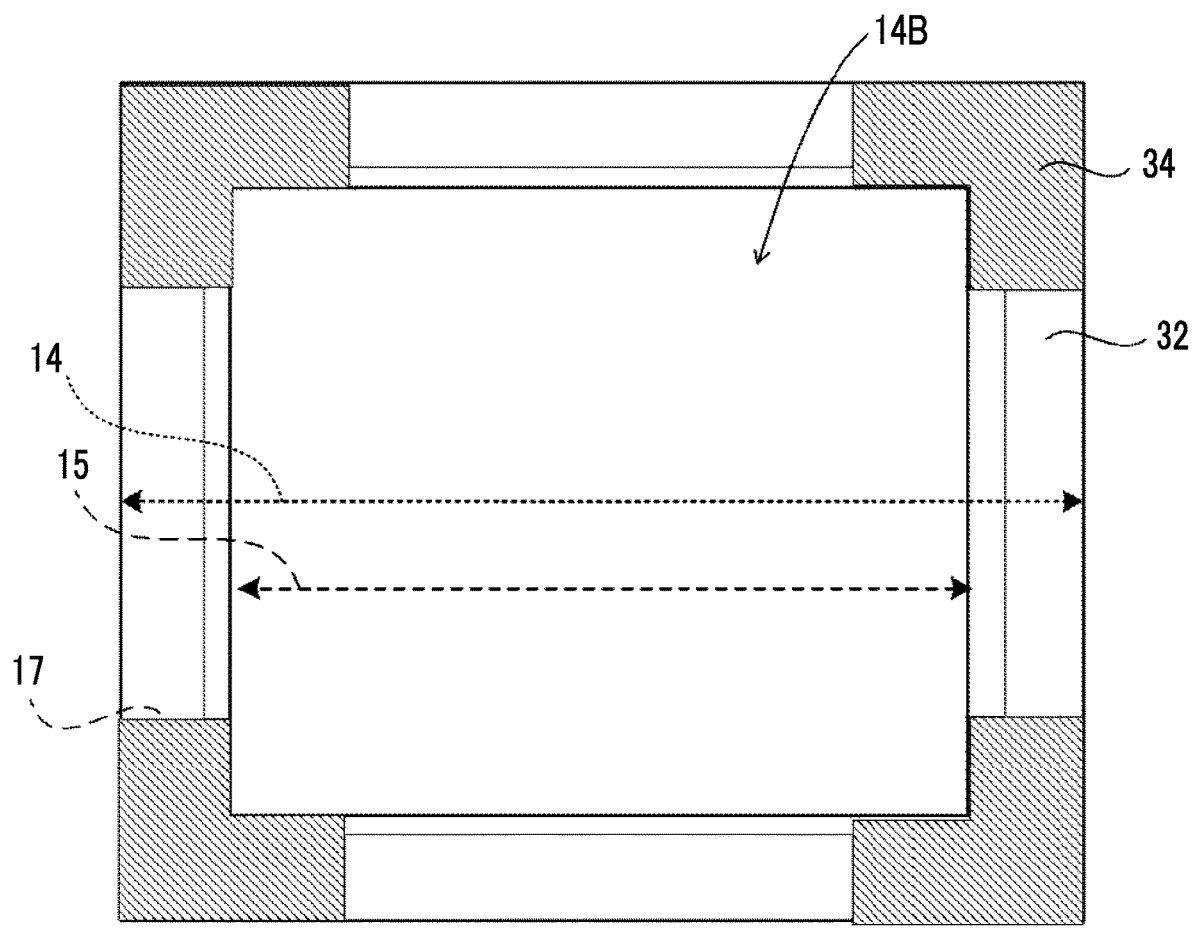
FIG. 14 is a plan view of the radiation detector as seen from the second surface side in order to describe still another example of a supporting member.
Figure 15:
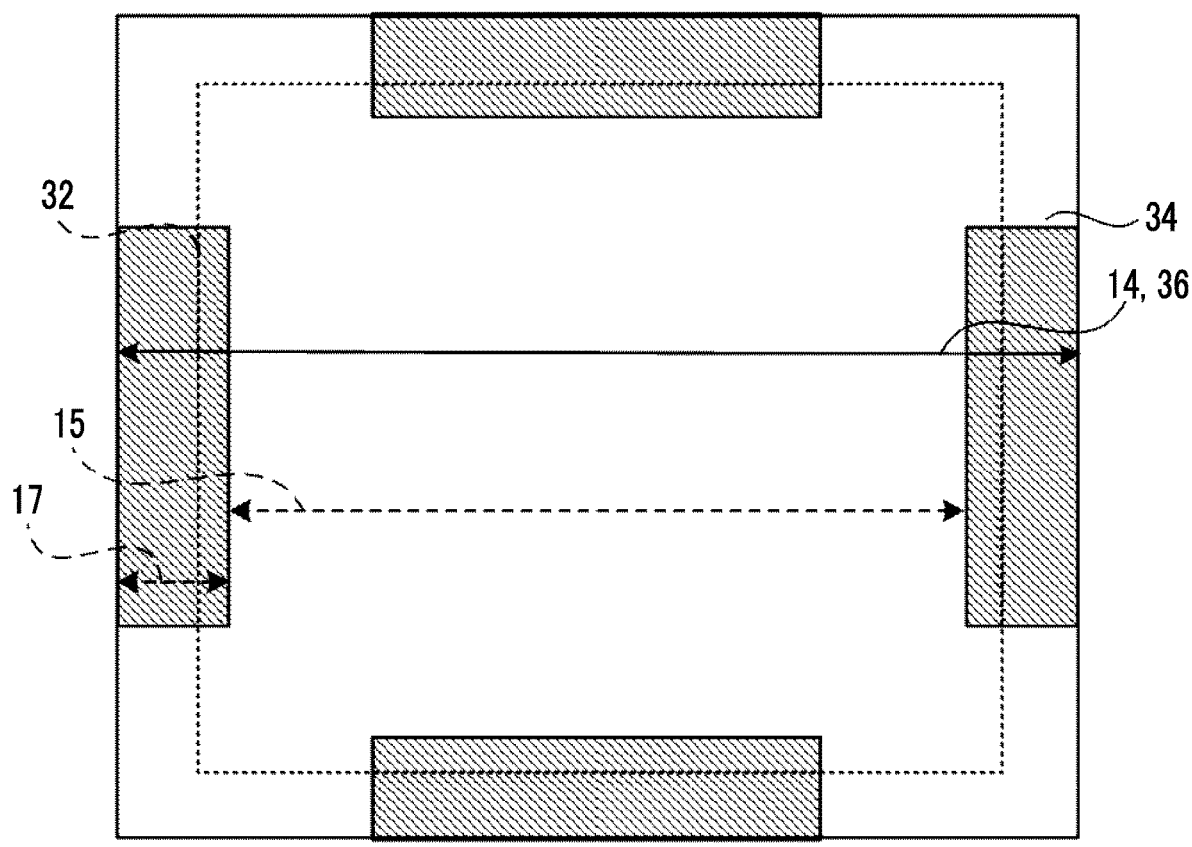
FIG. 15 is a plan view of the radiation detector as seen from the second surface side in order to describe still another example of a supporting member.
Figure 16:
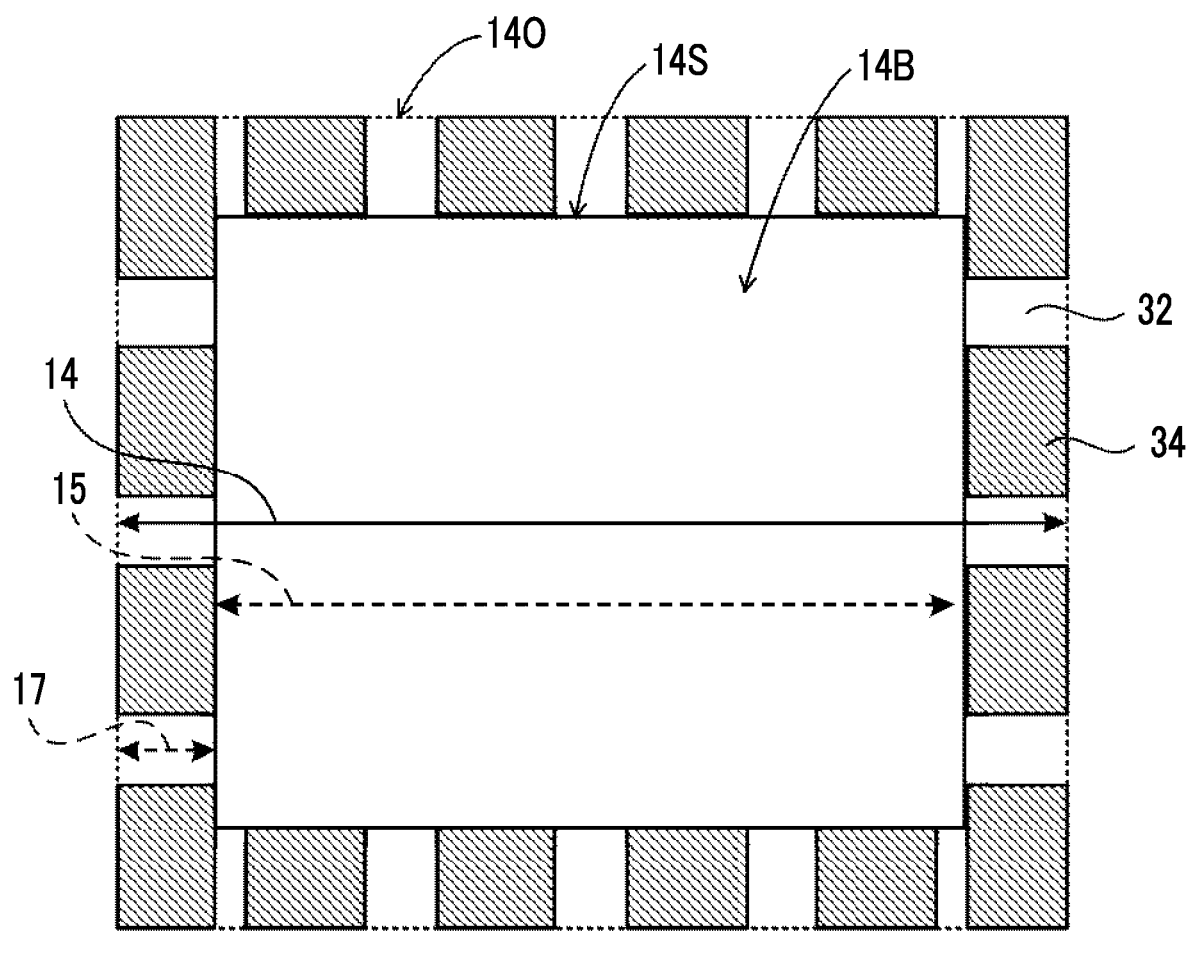
FIG. 16 is a plan view of the radiation detector as seen from the second surface side in order to describe still another example of a supporting member.

For example, as illustrated in FIG. 14, the supporting member 34 may be provided at each of four corners of the sensor board 12. Additionally, for example, as illustrated in FIG. 15, the supporting member 34 may be provided at the center of each of four sides of the sensor board 12. Additionally, for example, as illustrated in FIG. 16, a plurality of (sixteen in FIG. 16) supporting members 34 may be provided along a peripheral edge 14S on the peripheral edge 14S inward at a predetermined distance from an outer periphery 14O of the second surface 14B of the substrate 14. In addition, in the radiation detector 10 illustrated in FIG. 16, the peripheral edge 14S where the supporting member 34 is provided is the boundary between the active area 15 and the region 17. However, the invention is not limited particularly. In addition, since the total length of the plurality of supporting members 34 along the peripheral edge 14S is equal to or more than half of the length of the peripheral edge 14S or less than the length of the peripheral edge 14S, the effect of suppressing the deflection in the region 17 is further enhanced by the supporting member 34. Additionally, for example, a form in which the supporting members 34 are provided all the sides of the rectangular sensor board 12 has been described in each of the above embodiments. However, the supporting members 34 may be only at some sides of the sensor board 12.

Figure 17:
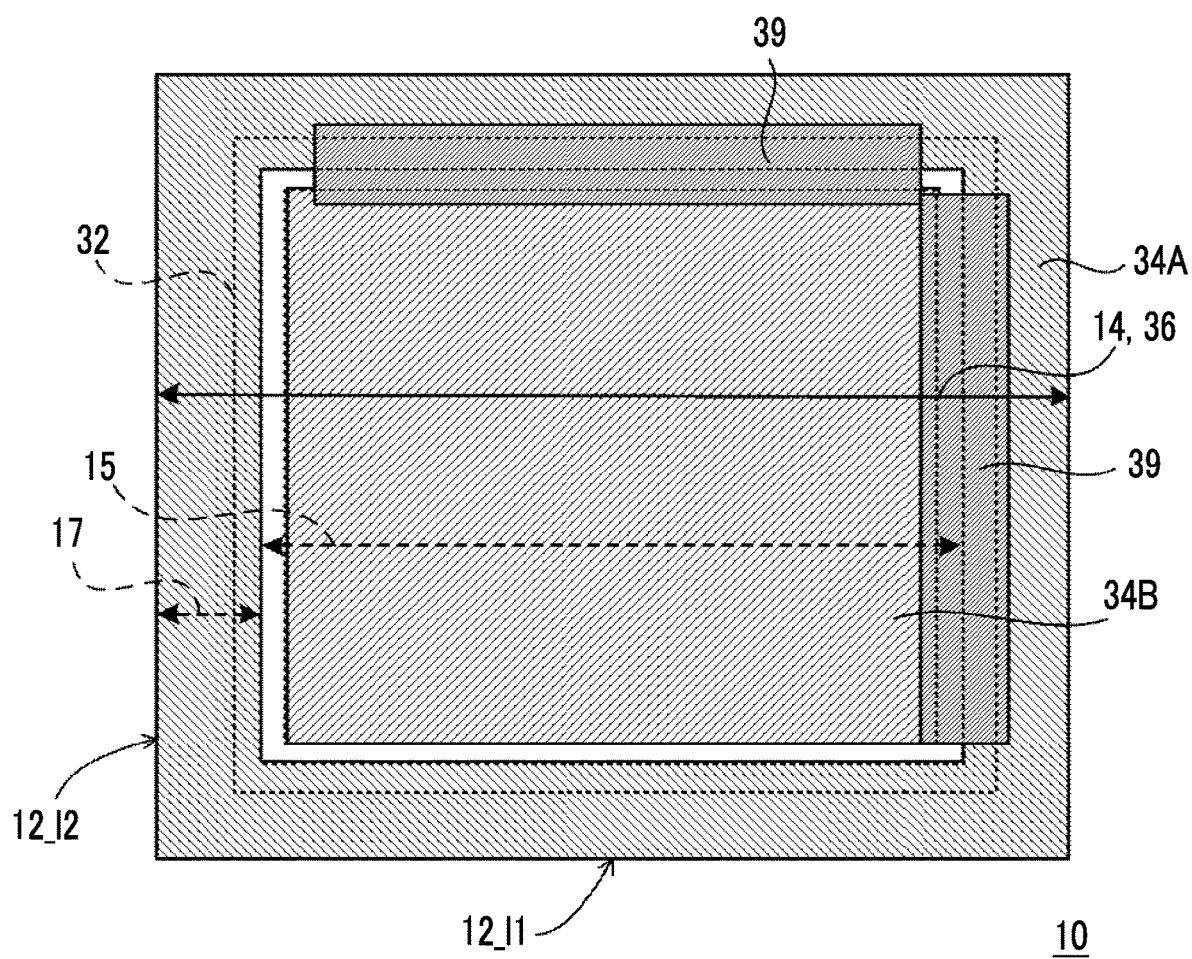
FIG. 17 is a plan view of the radiographic imaging apparatus as seen from the second surface side of the radiation detector in order to describe another example of a position where the supporting member is provided.

Additionally, a form in which heat transfer members 39 thermally connecting the first supporting member 34A and the second supporting member 34B together are provided at all the sides of the rectangular sensor board 12 has been described in the above second to sixth embodiments. However, heat transfer members 39 may be provided only at some sides of the sensor board 12. For example, a form in which no heat transfer member 39 is provided at the sides of the sensor board 12 having a terminal (not illustrated) to which a flexible cable (equivalent to examples of a first cable and a second cable of the present disclosure), such as the flexible cable 112 connecting at least one of the drive unit 102, the signal processing unit 104, or the control unit 100 (control board 110) and the sensor board 12 together is connected may be provided. For example, FIG. 17 illustrates a case where the terminal (not illustrated) to which the flexible cable is connected to each of a side 12_11 and a side 12_12 of the sensor board 12. In the radiation detector 10 illustrated in FIG. 17, no heat transfer member 39 is not provided at each of the side 12_11 and the side 12_12. There is a case where respective circuit parts in the drive unit 102, the signal processing unit 104, and the control unit 100 are weak to heat. In this case, it is preferable to adopt a form in which no heat transfer member 39 is provided at the sides of the sensor board 12 having the terminal (not illustrated) to which the flexible cable is connected, in order to suppress heat transfer to the circuit parts from the sensor board 12.

Figure 18:
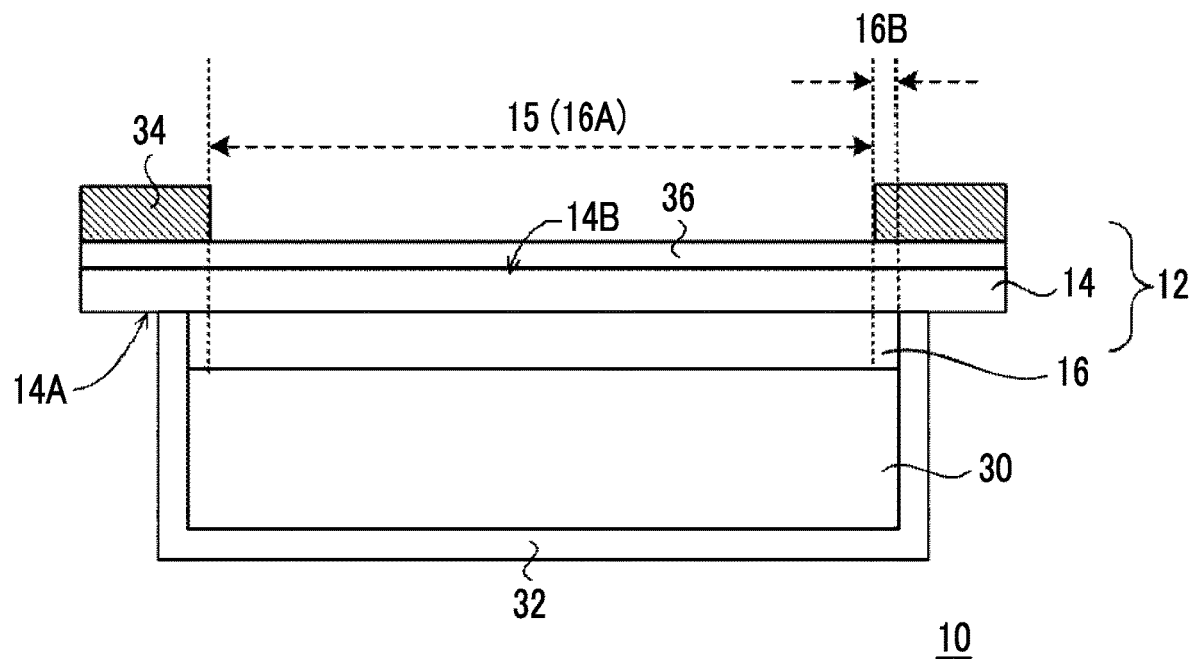
FIG. 18 is a cross-sectional view of another example of the radiation detector for describing another example of an active area.

Additionally, in the radiation detector 10 of each of the above first to sixth embodiments, a form in which the entire region where the pixels 16 are provided is the active area 15 has been described. However, the region used as the active area 15 is not limited to that in each of the above embodiments. For example, the active area 15 may be specified by a region corresponding to some pixels 16 among the plurality of pixels 16. For example, in the radiation detector 10, as illustrated in FIG. 18, there is a case in which the pixels 16 includes a plurality of first pixels 16A substantially corresponding to pixels of a radiation image, and a plurality of second pixels 16B that have a different application in the formation of the radiation image and are provided at an outer peripheral part of the first pixels 16A. In addition, the different application in the formation of the radiation image herein means, for example, a case where the pixels are not used in the formation of the radiation image but electrical charges thereof are discarded, in addition to a case where the pixels are used for the correction of the image. In the radiation detector 10 illustrated in FIG. 18, the region where the first pixels 16A are provided is defined as the active area 15.

In addition, as in the radiation detector 10 illustrated in FIG. 18, there is a case where the conversion layer 30 is larger than the active area 15 and the conversion layer 30 covers the entire active area 15. For example, in a case where the deviation of a vapor deposition position, the deviation of a gluing position, or the like with respect to the sensor board 12 in the formation of the conversion layer 30 are taken into consideration in addition to the above case illustrated in FIG. 18, the conversion layer 30 is provided to be larger than the active area 15. In this case, as illustrated in FIG. 18, it is preferable to sandwich and support the substrate 14 by the supporting member 34 and the conversion layer 30 outside the active area 15.

In addition, in the radiation detector 10 of each of the above first to sixth embodiments, in order to suppress the deflection of the sensor board 12, a form in which the reinforcing member 36 and the supporting member 34 are provided has been described. However, in order to suppress the deflection of the sensor board 12, other members or the like may be further provided. For example, a reinforcing layer may be further provided on the surface of the conversion layer 30 opposite to the side provided on the sensor board 12. For example, a cross-sectional view of an example of the radiation detector 10 in a case where the above reinforcing layer is provided on the radiation detector 10 illustrated in FIG. 18. In a radiation detector 10 illustrated in FIG. 19, a reinforcing layer 37 may be provided on the surface of the conversion layer 30 opposite to the side provided on the sensor board 12. In other words, the substrate 14 and the conversion layer 30 are sandwiched by the reinforcing member 36 and the reinforcing layer 37. By providing the reinforcing layer 37 in this way, more discontinuous deflection of the sensor board can be further suppressed.

Figure 19:
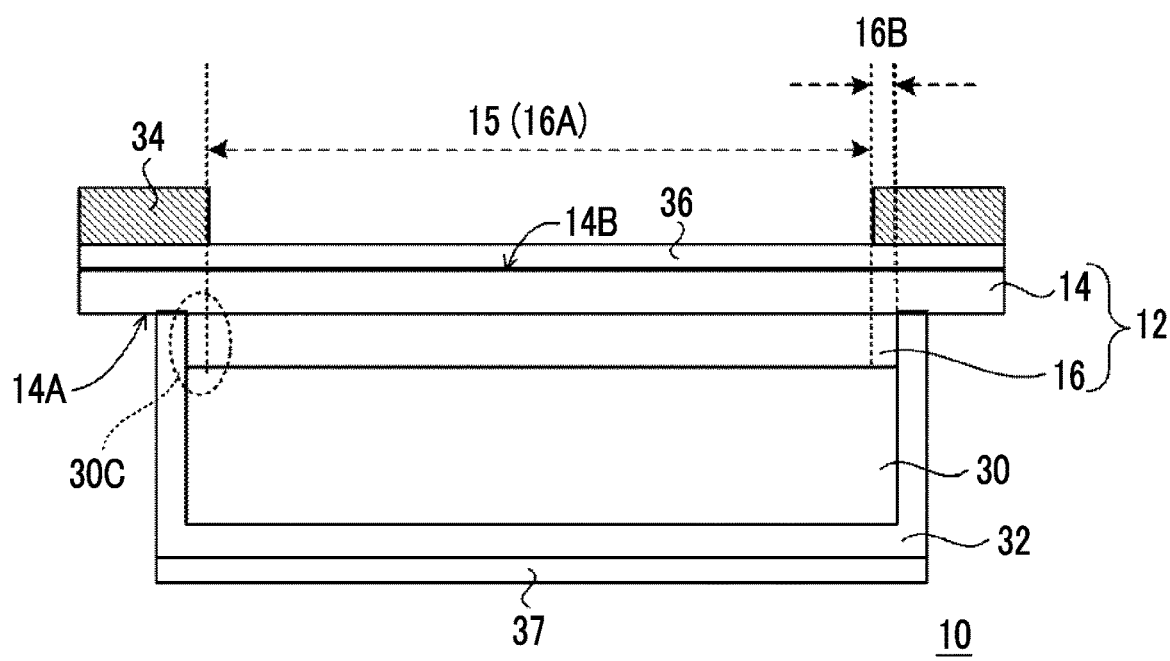
FIG. 19 is a sectional view of an example in which a reinforcing layer is further included in the radiation detectors of the first to sixth embodiments.

Additionally, in the radiation detector 10 illustrated in FIG. 19, the reinforcing layer 37 faces the supporting member 34 with the sensor board 12 sandwiched therebetween in a region straddling an end part 30C of the conversion layer 30. Therefore, since the end part 30C of the conversion layer 30 is fixed by the reinforcing member 36 and the reinforcing layer 37, the peeling of the conversion layer 30 from the substrate 14 can be suppressed. In addition, such a reinforcing layer 37 may be, for example, the same member as the reinforcing member 36. Additionally, for example, even for the same member, the reinforcing layer 37 may have a different thickness such that the reinforcing layer 37 is thinner, or may have a different flexibility.

In each of the above first to the sixth embodiments, as described above, a form in which the supporting member 34 supports the reinforcing member 36 with the reinforcing member 36 sandwiched between the supporting member 34 and the second surface 14B of the substrate 14 and the reinforcing member 36 is provided on the second surface 14B opposite to the first surface 14A of the substrate 14 has been described. In the following respective embodiments, other forms of the supporting member 34 and the reinforcing member 36 will be described. In addition, in each of the following embodiments, since the configuration of the radiation detector 10 other than the supporting member 34 and the reinforcing member 36 is the same as that of the radiation detector 10 of the first embodiment except that the active area 15 is the same as that of the above-described radiation detector 10 illustrated in FIG. 18, detailed description thereof will be omitted.

Seventh Embodiment

Figure 20:
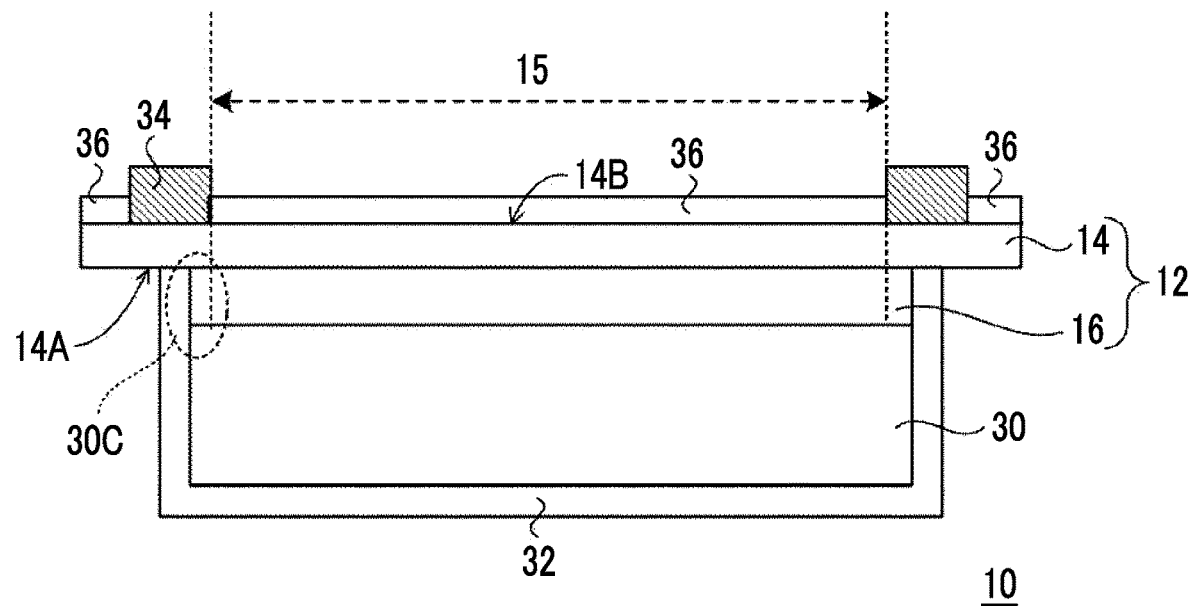
FIG. 20 is a cross-sectional view of an example of a radiation detector of a seventh embodiment.

A cross-sectional view of an example of the radiation detector 10 of the present embodiment is illustrated in FIG. 20. As illustrated in FIG. 20, the supporting member 34 of the present embodiment is provided in a region straddling the region corresponding to the end part 30C of the conversion layer 30, outside the region corresponding to the active area 15 on the second surface 14B of the substrate 14.

Additionally, as illustrated in FIG. 20, the reinforcing member 36 is provided outside the region on the second surface 14B of the substrate 14 where the supporting member 34 is provided. In other words, the supporting member 34 covers the entire region on the second surface 14B of the substrate 14 where the supporting member 34 is not provided.

As illustrated in FIG. 20, the supporting member 34 and the reinforcing member 36 are similarly provided on the second surface 14B of the substrate 14. However, similar to the above first to sixth embodiments, as illustrated in FIG. 20, thickness is different, and the thickness of the supporting member 34 is greater than the thickness of the reinforcing member 36.

As in the above first to sixth embodiments and the present embodiment, in a case where the flexible substrate 14 in the sensor board 12 is deflected in a case where the radiation detector 10 using the flexible substrate 14 for the sensor board 12 is handled as a single body, for example, in a case where handling in a so-called manufacturing process until the substrate 14 is provided within the housing 120 is performed, for example, in a process for manufacturing the radiographic imaging apparatus 1, there is a high possibility that discontinuous deflection occurs in the substrate 14 at a position (hereinafter referred to as an "end part position") corresponding to the end part 30C of the conversion layer 30. In a case where discontinuous deflection occurs in the sensor board 12 at the end part position, the conversion layer 30 is easily peeled from the sensor board 12.

In the radiation detector 10 of the present embodiment, the supporting member 34 is provided in the region straddling the region corresponding to the end part 30C of the conversion layer 30, that is, the end part position, outside the region corresponding to the active area 15 on the second surface 14B of the substrate 14. Therefore, according to the radiation detector 10 of the present embodiment, even in a case where the substrate 14 is deflected, the conversion layer 30 is not easily peeled from the sensor board 12.

Additionally, according to the radiation detector 10 of the present embodiment, the reinforcing member 36 is provided on the second surface 14B of the substrate 14. Therefore, the stiffness of the substrate 14 can be reinforced, and the discontinuous deflection of the sensor board 12 using the flexible substrate 14 can be suppressed.

Figure 21:
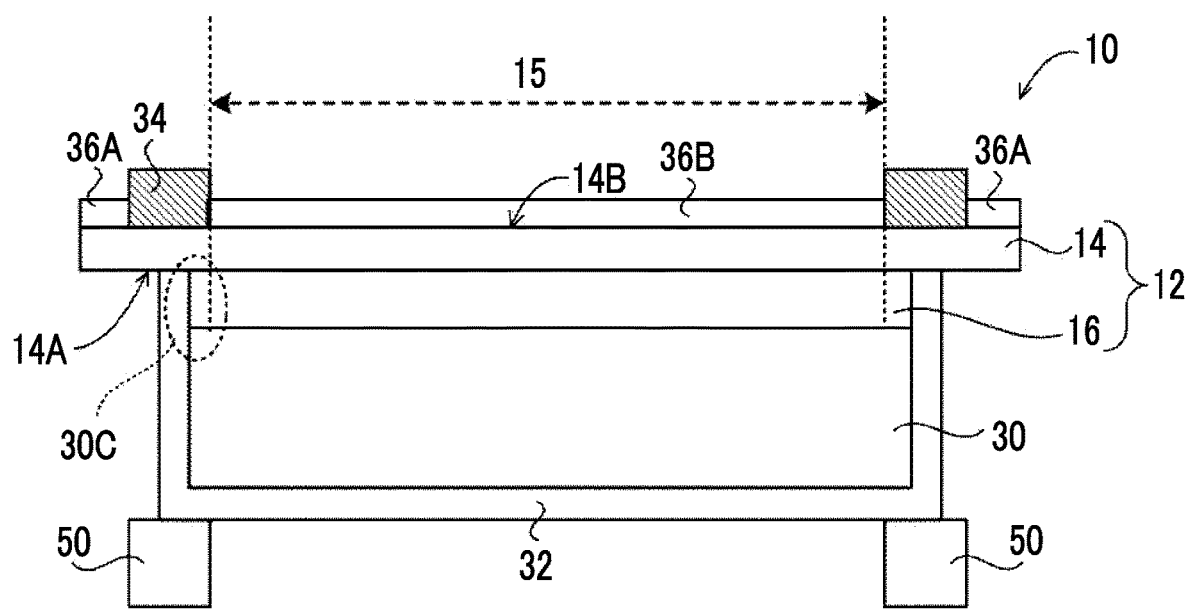
FIG. 21 is a cross-sectional view for illustrating an example of a state where the radiation detector illustrated in FIG. 20 is provided within the radiographic imaging apparatus.

In addition, in a case where the radiation detector 10 of the present embodiment is housed within the housing 120 to form the radiographic imaging apparatus 1, as in an example illustrated in FIG. 21, it is preferable to dispose a rib 50 for supporting and fixing the radiation detector 10 at a position that faces the supporting member 34 with the substrate 14 and the conversion layer 30 sandwiched therebetween. In the example illustrated in FIG. 21, since the end part 30C of the conversion layer 30 is fixed by the supporting member 34 and the rib 50, the peeling of the conversion layer 30 from the substrate 14 can be further suppressed.

Figure 22:
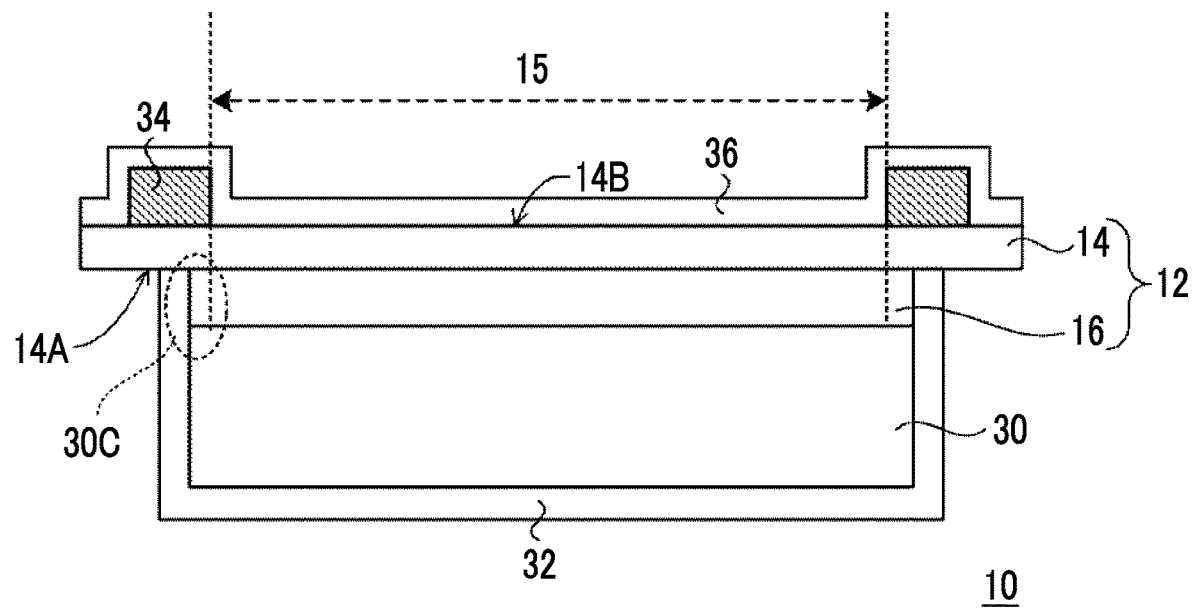
FIG. 22 is a cross-sectional view of another example of the radiation detector of the seventh embodiment.

In addition, the specific arrangement of the reinforcing member 36 provided on the second surface 14B of the substrate 14 is not limited to the form illustrated in FIG. 20. For example, as in an example illustrated in FIG. 22, the reinforcing member 36 may be provided in a region that covers the second surface 14B of the substrate 14 in a state where the supporting member 34 is provided.

Additionally, in the radiation detector 10 of the present embodiment, a form in which the supporting member 34 is provided only up to the inside of the end part of the substrate 14 (sensor board 12) has been described. However, similar to the above first to sixth embodiments, a form in which the supporting member 34 is provided up to the position of the end part of the substrate 14 may be adopted.

Eighth Embodiment

In the radiation detector 10 of the present embodiment, a configuration in which a position where the reinforcing member 36 is different from that of the seventh embodiment will be described.

Figure 23:
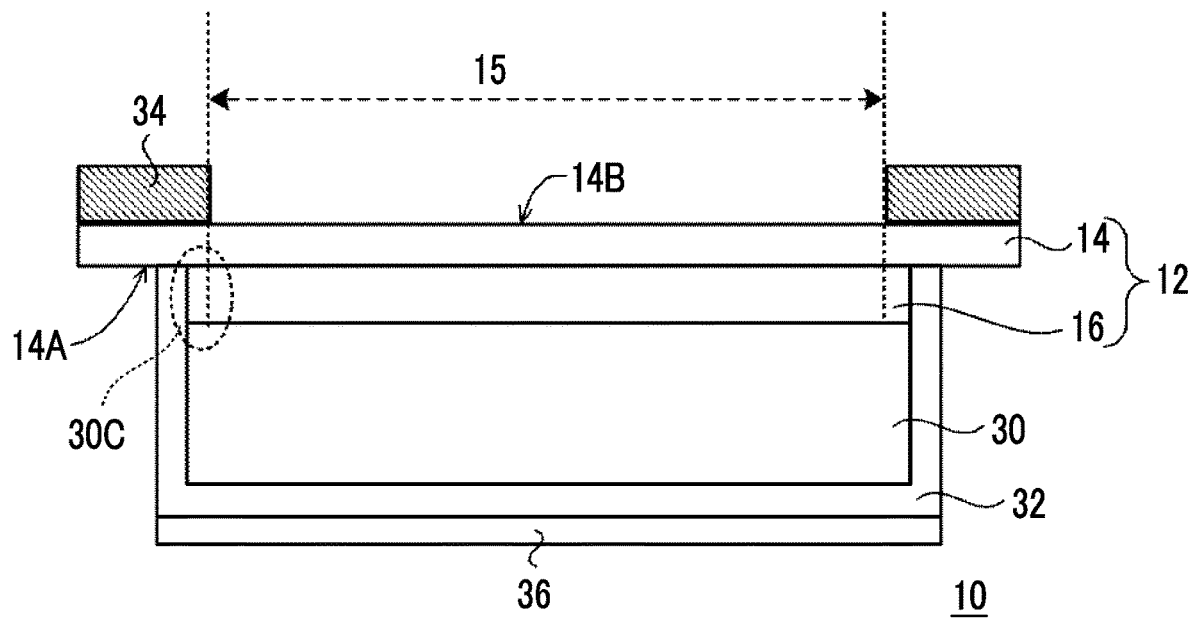
FIG. 23 is a cross-sectional view of an example of a radiation detector of an eighth embodiment.

A cross-sectional view of an example of the radiation detector 10 of the present embodiment is illustrated in FIG. 23. As illustrated in FIG. 23, similar to the supporting member 34 in the radiation detector 10 of the seventh embodiment, the supporting member 34 is provided in the region straddling the region corresponding to the end part 30C of the conversion layer 30, that is, the end part position, outside the region corresponding to the active area 15 on the second surface 14B of the substrate 14. In addition, as illustrated in FIG. 23, in the radiation detector 10 of the present embodiment, the supporting member 34 is provided up to the position of the end part of the substrate 14. However, similar to the radiation detector 10 of the seventh embodiment, a form in which the supporting member 34 is provided only up to the inside of the end part of the substrate 14 may be adopted.

Additionally, as illustrated in FIG. 23, the reinforcing member 36 of the present embodiment is provided on the side of the conversion layer 30 opposite to the sensor board 12 with the protective film 32 sandwiched therebetween. As illustrated in FIG. 23, in the radiation detector 10 of the present embodiment, at least a partial region of the supporting member 34 and a partial region of the reinforcing member 36 face each other with the sensor board 12 and the conversion layer 30 sandwiched therebetween.

In this way, in the radiation detector 10 of the present embodiment, the reinforcing member 36 and the supporting member 34 face each other with the sensor board 12 sandwiched therebetween in the region (end part position) straddling the end part 30C of the conversion layer 30. Therefore, since the end part 30C of the conversion layer 30 is fixed by the supporting member 34 and the reinforcing member 36, the peeling of the conversion layer 30 from the substrate 14 can be suppressed.

Additionally, according to the radiation detector 10 of the present embodiment, the reinforcing member 36 is provided on the side of the conversion layer 30 opposite to the sensor board 12 with the protective film 32 sandwiched therebetween. Therefore, the stiffness of the substrate 14 can be reinforced, and the discontinuous deflection of the sensor board 12 using the flexible substrate 14 can be suppressed.

Figure 24:
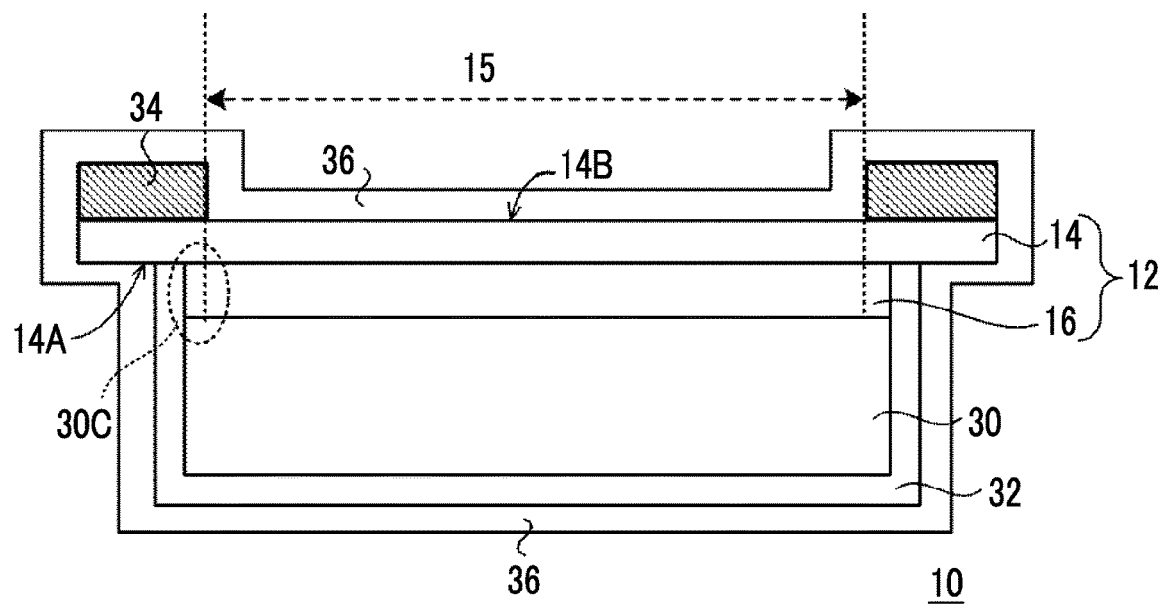
FIG. 24 is a cross-sectional view of another example of the radiation detector of the eighth embodiment.

In addition, the reinforcing member 36 may be provided at least at a position sandwiching the protective film 32 on the side of the conversion layer 30 opposite to the sensor board 12, and the specific arrangement thereof is not limited to the form illustrated in FIG. 23. For example, as in an example illustrated in FIG. 24, the reinforcing member 36 may be disposed in a state where the entire sensor board 12 in a state where the conversion layer 30, the protective film 32, and the supporting member 34 are provided is covered.

Figure 25:
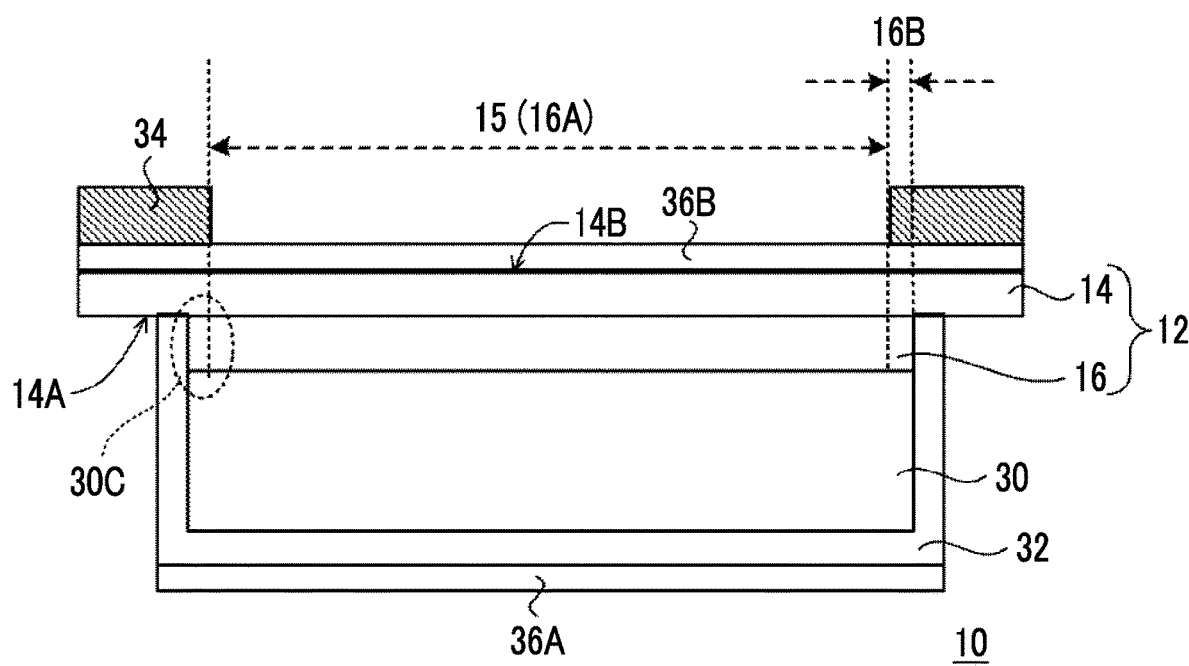
FIG. 25 is a cross-sectional view of still another example of the radiation detector of the eighth embodiment.

Additionally, the radiation detector 10 may have a form including a plurality of the reinforcing members 36. For example, as in an example illustrated in FIG. 25, the radiation detector 10 may have as a form including a first reinforcing member 36A on the side of the conversion layer 30 opposite to the sensor board 12 with the protective film 32 sandwiched therebetween, and a second reinforcing member 36B provided on the second surface 14B of the substrate 14. In this case, since the sensor board 12 is sandwiched by the first reinforcing member 36A and the second reinforcing member 36B, the discontinuous deflection of the sensor board 12 using the flexible substrate 14 can be further suppressed.

As described above, the radiation detector 10 of each of the above seventh and eighth embodiments includes the sensor board 12 including the flexible substrate 14, and the layer in which the plurality of pixels 16, which are provided on the first surface 14A of the substrate 14 and accumulate electrical charges generated in accordance with light converted from radiation, are formed, the conversion layer 30 that includes a pixel region provided with a plurality of pixels contributing to formation of an image, on a side, opposite to the substrate 14, in the layer in which the pixels 16 are formed, is provided in a state where a range wider than the pixel region is covered, and converts radiation into light, the protective film 32 that covers at least the conversion layer 30, the reinforcing member 36 that reinforces the flexible substrate 14, and the supporting member 34 that is provided in the region straddling the region (end part position) corresponding to the end part 30C of the conversion layer 30, outside the region corresponding to the active area 15, on the second surface 14B of the substrate 14.

In this way, in the radiation detector 10 of each of the above seventh and eighth embodiments, the reinforcing member 36 that reinforces the stiffness of the substrate 14 is provided, and the supporting member 34 is provided in the region straddling the region corresponding to the end part 30C of the conversion layer 30, that is, the end part position, outside the region corresponding to the active area 15 on the second surface 14B of the substrate 14.

Therefore, according to the radiation detector 10 of each of the above seventh and eighth embodiments, the discontinuous deflection of the sensor board 12 using the flexible substrate 14 can be suppressed, and the conversion layer 30 is not easily peeled from the sensor board 12 even in a case where the substrate 14 is deflected.

Additionally, a case where the radiation detector 10 (radiographic imaging apparatus 1) is applied to the ISS type has been described in each of the above embodiments. However, the radiation detector 10 (radiographic imaging apparatus 1) may be applied to a so-called "penetration side sampling (PSS) type" in which the sensor board 12 is disposed on a side opposite to a side that the radiation of the conversion layer 30 enters. Even in a case where the sensor board using the flexible substrate is applied to the PSS type, there is a concern that the sensor board is discontinuously deflected. Even in the case of the PSS type, according to the radiation detector 10 of each of the above embodiments, the discontinuous deflection of the sensor board 12 can be suppressed by providing the supporting member 34 and the reinforcing member 36.

Additionally, a form in which the radiographic imaging apparatus 1 includes one radiation detector 10 has been described in each of the above embodiments. However, a form in which the radiographic imaging apparatus 1 includes a plurality of radiation detectors 10 may be adopted. For example, as illustrated in FIG. 26, the radiographic imaging apparatus 1 may have a form in which ISS-type radiation detectors 10_1 and 10_2 are used in an overlapping manner in the direction in which radiation is irradiated. In the case illustrated in FIG. 26, a radiation detector 10_1 in which a conversion layer 30_1 using CsI is formed by being directly vapor-deposited on a sensor board 12_1 in which pixels 16_1 are provided in a flexible substrate 14_1 is disposed at a position near an irradiation side of radiation. Additionally, a radiation detector 10_2 in which a conversion layer 30_2 is formed by gluing a GOS sheet to a sensor board 12_2 in which pixels 16_2 are provided in a flexible substrate 14_2 is disposed at a position distant from the irradiation side of radiation. In addition, similar to the radiation detector 10 of the first embodiment, a state where a protective film 32_1, a supporting member 34_1, and a reinforcing member 36_1 are provided in a radiation detector 10_1, and a protective film 32_2, a supporting member 34_2, and a reinforcing member 36_2 are provided in a radiation detector 10_2 is illustrated in FIG. 26.

In this case, it is preferable that a buffer layer 40 having transparency with respect to radiation is provided on the surface of the substrate 14 that is not in contact with the reinforcing member 36_1. Additionally, a tip of a columnar crystal of CsI of the conversion layer 30_1 faces the radiation detector 10_2 side. Therefore, in order to prevent the tip of the columnar crystal or its peripheral part from being damaged, it is preferable to provide a buffer layer 42 having transparency with respect to visible light between the reinforcing member 36_2 and the protective film 32_1.

Additionally, in each of the above embodiments, as illustrated in FIG. 1, an aspect in which the pixels 16 are two-dimensionally arrayed in a matrix has been described. However, the pixels 16 may be one-dimensionally arrayed or may be arrayed in a honeycomb arrangement. Additionally, the shape of the pixels is also not limited, and may be a rectangular shape, or may be a polygonal shape, such as a hexagonal shape. Moreover, it goes without saying that that the shape of the active area 15 is also not limited.

In addition, it goes without saying that the configurations, manufacturing methods, and the like of the radiographic imaging apparatuses 1, the radiation detectors 10, and the like that are described in the respective above embodiments are merely examples, and can be modified in accordance with situations without departing from the scope of the invention.

The disclosure of JP2017-056559 filed on Mar. 22, 2017, and the disclosure of JP2018-025803 filed on Feb. 16, 2018 are incorporated into the present specification by reference in its entirety.

All documents, patent applications, and technical standards described in the present specification are incorporated in the present specification by reference in their entireties to the same extent as in a case where the individual documents, patent applications, and technical standards are specifically and individually written to be incorporated by reference.

What is claimed is:

1. A radiographic imaging apparatus comprising:
a base; and
a radiation detector, the radiation detector comprising:
a sensor board including a flexible substrate and a layer which is provided on a first surface of the substrate and in which a plurality of pixels, which accumulate electrical charges generated in accordance with light converted from radiation, are formed;
a conversion layer that is provided on a side, opposite to the substrate, of the layer in which the pixels are formed, and converts radiation into light;
a protective film that covers at least the conversion layer;
a reinforcing member that reinforces a stiffness of the flexible substrate; and
a supporting member that supports the sensor board together with the reinforcing member,
wherein the reinforcing member is provided at a position opposite from the first surface of the substrate, and is positioned at an outermost layer of the radiation detector, and
wherein the base is provided at a position opposite from the substrate with respect to the conversion layer.

2. The radiation detector according to claim 1, which is used for imaging in which a second surface of the substrate, which is opposite to the first surface of the substrate, is irradiated with radiation.

3. The radiation detector according to claim 1, wherein the conversion layer includes CsI.

4. A radiographic imaging apparatus comprising:
the radiation detector according to claim 1;
a control unit that outputs control signals for reading electrical charges accumulated in the plurality of pixels;
a drive unit that outputs a driving signal for reading the electrical charges from the plurality of pixels, in accordance with the control signals; and
a signal processing unit that receives electrical signals according to the electrical charges read from the plurality of pixels and generates image data according to the received electrical signals to output the generated image data.

5. The radiographic imaging apparatus according to claim 4, wherein the control unit and the radiation detector are provided side by side in a direction intersecting a lamination direction in which a substrate in the radiation detector, a layer in which the plurality of pixels are formed, and a conversion layer are arranged.

6. The radiographic imaging apparatus according to claim 4, further comprising:
a power source unit that supplies electrical power to at least one of the control unit, the drive unit, or the signal processing unit,
wherein the power source unit, the control unit, and the radiation detector are provided side by side in a direction intersecting a lamination direction in which a substrate in the radiation detector, a layer in which the plurality of pixels are formed, and a conversion layer are arranged.

7. A radiation detector, comprising:
a sensor board including a flexible substrate and a layer which is provided on a first surface of the substrate and in which a plurality of pixels, which accumulate electrical charges generated in accordance with light converted from radiation, are formed;
a conversion layer that is provided on a side, opposite to the substrate, of the layer in which the pixels are formed, and converts radiation into light;
a protective film that covers at least the conversion layer;
a reinforcing member that reinforces a stiffness of the flexible substrate; and
a supporting member that supports the sensor board together with the reinforcing member,
wherein the reinforcing member is provided on a second surface of the substrate, which is opposite to the first surface of the substrate, and
wherein the supporting member supports the reinforcing member with the reinforcing member sandwiched between the supporting member and the second surface of the substrate.

8. The radiation detector according to claim 7, wherein the supporting member supports the reinforcing member with the reinforcing member sandwiched between the supporting member and a region on the second surface corresponding to a region outside a pixel region that is a region, on the first surface of the substrate, where the plurality of pixels are provided.

9. The radiation detector according to claim 7,
wherein the plurality of pixels include a plurality of first pixels, and a plurality of second pixels that are provided at an outer peripheral part of the plurality of first pixels and have a different application from the plurality of first pixels in forming a radiation image, and
wherein the supporting member supports the reinforcing member with the reinforcing member sandwiched between the supporting member and a region, on the second surface of the substrate, corresponding to the outside of a region where the first pixels are provided.

10. The radiation detector according to claim 7, wherein the supporting member includes a first supporting member that supports the reinforcing member with the reinforcing member sandwiched between the first supporting member and a first region corresponding to an end part of the second surface of the substrate, and a second supporting member that supports the reinforcing member with the reinforcing member sandwiched between the second supporting member and a region, on the second surface of the substrate, outside the first region.

11. The radiation detector according to claim 10, wherein the first supporting member and the second supporting member are thermally connected together.

12. The radiation detector according to claim 10,
wherein the sensor board has an outer peripheral part including a connecting part to which at least one of a first cable or a second cable is connected, the first cable being connected to a drive unit that causes electrical charges to be read therethrough from the plurality of pixels, and the second cable being connected to a signal processing unit that receives electrical signals according to the electrical charges read from the plurality of pixels and generates image data according to the received electrical signals to output the generated image data, and
wherein the first supporting member and the second supporting member are thermally connected together outside a region of the outer peripheral part including the connecting part.

13. The radiation detector according to claim 7,
wherein the protective film further covers a predetermined region in an outer peripheral part of the second surface of the substrate, and wherein the supporting member supports the reinforcing member with the reinforcing member sandwiched between the supporting member and the second surface of the substrate in the predetermined region.

14. The radiation detector according to claim 13, wherein the protective film includes at least a first protective film that covers at least the conversion layer, and a second protective film that covers a region including the predetermined region and the entire first protective film.

15. The radiation detector according to claim 13, wherein the protective film includes at least a first protective film that covers at least the conversion layer, and a second protective film that covers a region including the predetermined region and an end part of the first protective film.

16. The radiation detector according to claim 7, further comprising a reinforcing layer that is provided on a surface of the conversion layer opposite to a surface provided on the sensor board.

17. A radiation detector, comprising:
a sensor board including a flexible substrate and a layer which is provided on a first surface of the substrate and in which a plurality of pixels, which accumulate electrical charges generated in accordance with light converted from radiation, are formed;
a conversion layer that is provided on a side, opposite to the substrate, of the layer in which the pixels are formed, and converts radiation into light;
a protective film that covers at least the conversion layer;
a reinforcing member that reinforces a stiffness of the flexible substrate; and
a supporting member that supports the sensor board together with the reinforcing member,
wherein the conversion layer includes a pixel region where the plurality of pixels contributing to formation of an image are provided and is provided in a state where a range wider than the pixel region is covered, and
wherein the supporting member is provided in a region straddling a region corresponding to an end part of the conversion layer, outside a region, corresponding to the pixel region, on a second surface of the substrate, which is opposite to the first surface of the substrate.

18. The radiation detector according to claim 17, wherein the reinforcing member is provided outside a region, on the second surface of the substrate, where the supporting member is provided.

19. The radiation detector according to claim 17, wherein the reinforcing member covers the second surface of the substrate in a state where the supporting member is provided.

20. The radiation detector according to claim 17, wherein the reinforcing member is provided on a side of the conversion layer opposite to the sensor board with the protective film sandwiched therebetween, and
wherein at least a partial region of the supporting member and a partial region of the reinforcing member face each other with the sensor board and the conversion layer sandwiched therebetween.

21. The radiation detector according to claim 17, wherein the reinforcing member includes a first reinforcing member provided on a side of the conversion layer opposite to the sensor board with the protective film sandwiched therebetween, and a second reinforcing member provided on the second surface of the substrate, and
wherein at least a partial region of the supporting member and a partial region of the first reinforcing member face each other with the second reinforcing member, the sensor board and the conversion layer sandwiched therebetween.

22. The radiation detector according to claim 17, wherein the reinforcing member covers the entire sensor board in a state where the conversion layer, the protective film, the supporting member are provided.

23. The radiation detector according to claim 17, wherein a thickness of the supporting member is greater than a thickness of the reinforcing member.

24. A radiation detector comprising:
a sensor board including a flexible substrate and a layer which is provided on a first surface of the substrate and in which a plurality of pixels, which accumulate electrical charges generated in accordance with light converted from radiation, are formed;
a conversion layer that is provided on a side, opposite to the substrate, of the layer in which the pixels are formed, and converts radiation into light;
a protective film that covers at least the conversion layer;
a reinforcing member that reinforces a stiffness of the flexible substrate; and
a supporting member that supports the sensor board together with the reinforcing member,
wherein the reinforcing member is provided at a position opposite from the first surface of the substrate, and
wherein the reinforcing member is a layered sheet in which an aluminum foil is bonded on an insulating sheet.

* * * * *